US012617986B2

(12) United States Patent
Kawai

(10) Patent No.: US 12,617,986 B2
(45) Date of Patent: May 5, 2026

(54) RESIN COMPOSITION, CURED PRODUCT, SHEET-LIKE LAMINATE MATERIAL, RESIN SHEET, PRINTED WIRING BOARD, AND SEMICONDUCTOR DEVICE

(71) Applicant: AJINOMOTO CO., INC., Tokyo (JP)

(72) Inventor: Kenji Kawai, Kawasaki (JP)

(73) Assignee: AJINOMOTO CO., INC., Tokyo (JP)

( * ) Notice: Subject to any disclaimer, the term of this patent is extended or adjusted under 35 U.S.C. 154(b) by 0 days.

(21) Appl. No.: 18/649,929

(22) Filed: Apr. 29, 2024

(65) Prior Publication Data

US 2024/0287360 A1 Aug. 29, 2024

Related U.S. Application Data

(62) Division of application No. 17/496,382, filed on Oct. 7, 2021, now abandoned.

(30) Foreign Application Priority Data

Oct. 9, 2020 (JP) ................................ 2020-171474

(51) Int. Cl.

| | |
|---|---|
| ***C09J 163/00*** | (2006.01) |
| ***B32B 5/02*** | (2006.01) |
| ***B32B 15/09*** | (2006.01) |
| ***B32B 27/12*** | (2006.01) |
| ***B32B 27/36*** | (2006.01) |
| ***C08L 63/00*** | (2006.01) |
| ***C09J 7/25*** | (2018.01) |
| ***C09J 7/29*** | (2018.01) |
| ***C09J 7/35*** | (2018.01) |
| ***H05K 1/03*** | (2006.01) |

(52) U.S. Cl.

CPC ............... *C09J 163/00* (2013.01); *B32B 5/02* (2013.01); *B32B 15/09* (2013.01); *B32B 27/12* (2013.01); *B32B 27/36* (2013.01); *C08L 63/00* (2013.01); *C09J 7/255* (2018.01); *C09J 7/29* (2018.01); *C09J 7/35* (2018.01); *H05K 1/0326* (2013.01); *H05K 1/0366* (2013.01); *B32B 2260/021* (2013.01); *B32B 2260/046* (2013.01); *B32B 2262/101* (2013.01); *B32B 2307/206* (2013.01); *B32B 2457/08* (2013.01); *C08L 2203/20* (2013.01); *C09J 2400/163* (2013.01); *C09J 2463/00* (2013.01); *C09J 2467/006* (2013.01)

(58) Field of Classification Search

None

See application file for complete search history.

(56) References Cited

U.S. PATENT DOCUMENTS

| | | | |
|---|---|---|---|
| 2021/0284833 | A1 | 9/2021 | Hayashi |
| 2022/0169781 | A1 | 6/2022 | Wasano |

FOREIGN PATENT DOCUMENTS

| | | | |
|---|---|---|---|
| CN | 102504201 A | | 6/2012 |
| JP | 2020-055890 | | 9/2020 |
| WO | WO 2018/062404 | A1 | 4/2018 |
| WO | WO-2020/196604 | A1 | 10/2020 |

OTHER PUBLICATIONS

Combined Taiwanese Office Action and Search Report issued Jan. 17, 2025 in Taiwanese Patent Application No. 110137286 (with English translation of Office Action only), 12 pages.

*Primary Examiner* — Megan Mcculley

(74) *Attorney, Agent, or Firm* — Oblon, McClelland, Maier & Neustadt, L.L.P.

(57) ABSTRACT

Resin compositions including: (A) a naphthol aralkyl type epoxy resin having a weight-average molecular weight (Mw) of 1,000 or more and an epoxy equivalent of 350 g/eq. or more; and (B) a curing agent, in which (B) the curing agent includes an active ester type curing agent are useful for preparing cured products, sheet lamination materials, resin sheets, printed wiring boards, and semiconductor devices, and for methods for producing printed wiring boards or semiconductor devices.

19 Claims, No Drawings

RESIN COMPOSITION, CURED PRODUCT, SHEET-LIKE LAMINATE MATERIAL, RESIN SHEET, PRINTED WIRING BOARD, AND SEMICONDUCTOR DEVICE

REFERENCES TO RELATED APPLICATIONS

This application is a divisional application of U.S. application Ser. No. 17/496,382, filed on Oct. 7, 2021, which claims priority to Japanese Patent Application No. 2020-171474, filed on Oct. 9, 2020, which is incorporated herein by reference in its entirety.

BACKGROUND OF THE INVENTION

Field of the Invention

The present invention relates to resin compositions. The present invention further relates to cured products, sheet lamination materials, resin sheets, printed wiring boards, and semiconductor devices, and methods for producing printed wiring boards or semiconductor devices, all being obtained by using this resin composition.

Discussion of the Background

Japanese Patent Application Laid-open No. 2020-055890, which is incorporated herein by reference in its entirety, discloses, as the resin material used for a multi-layered printed wiring board, a resin material containing an epoxy compound having a naphthalene skeleton, an inorganic filler, and a curing agent. A resin material like this can be used to form an insulating layer in the multi-layered printed wiring board.

SUMMARY OF THE INVENTION

Accordingly, it is one object of the present invention to provide novel resin compositions capable of producing a cured product that is low in the roughness and excellent in adhesion to a conductor (hereinafter, this is called "conductor adhesion").

It is another object of the present invention to provide novel cured products, sheet lamination materials, resin sheets, printed wiring boards, and semiconductor devices, and methods for producing printed wiring boards or semiconductor devices, all of which being obtained by using such a resin composition.

These and other objects, which will become apparent during the following detailed description, have been achieved by the inventors' discovery that these objects could be achieved by using a resin composition having the composition described below.

Thus, the present invention includes the following embodiments.

(1) A resin composition comprising, (A) at least one naphthol aralkyl type epoxy resin having a weight-average molecular weight (Mw) of 1,000 or more and an epoxy equivalent of 350 g/eq. or more, and (B) at least one curing agent, Wherein (B) the curing agent comprises (B-1) an active ester type curing agent.

(2) The resin composition according to (1), wherein the component (A) comprises a compound represented by the following formula (A1):

(A1)

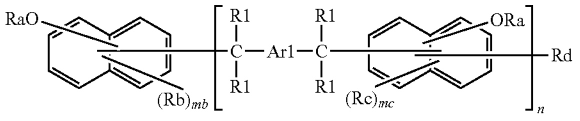

wherein:

Ar1 is an optionally substituted arylene group having 6 to 20 carbon atoms;

each Ra independently represents a hydrogen atom, a monovalent group having an epoxy group, or an alkyl group having 1 to 12 carbon atoms, in which at least one Ra is the monovalent group having an epoxy group, and at least one Ra is the alkyl group having 1 to 12 carbon atoms;

Rb and Rc each independently represent a monovalent group having an epoxy group, an alkyl group having 1 to 12 carbon atoms, an allyl group, or an aryl group having 6 to 10 carbon atoms;

Rd represents a hydrogen atom, a monovalent group having an epoxy group, an alkyl group having 1 to 12 carbon atoms, an allyl group, or an aryl group having 6 to 10 carbon atoms;

each R1 independently represents a hydrogen atom or an alkyl group having 1 to 12 carbon atoms;

n represents an integer of 2 to 50;

mb represents an integer of 0 to 6; and mc represents an integer of 0 to 5.

(3) The resin composition according to (2), wherein the component (A) comprises a compound represented by the following formula (A2):

(A2)

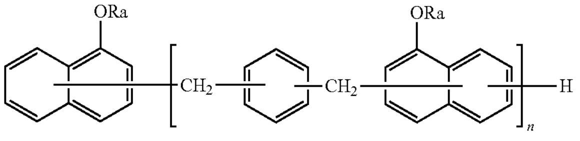

wherein Ra and n are the same as Ra and n, respectively, in the formula (A1).

(4) The resin composition according to (2) or (3), wherein n is 4 or more, and at least two Ra are an alkyl group having 1 to 6 carbon atoms.

(5) The resin composition according to any one of (1) to (4), wherein the component (B) further comprises (B-2) a curing agent other than the active ester type curing agent.

(6) The resin composition according to (5), wherein the component (B-2) is present in an amount which less than that of the component (B-1).

(7) The resin composition according to any one of (1) to (6), wherein the component (B-1) is present in an amount of 3 to 50% by mass relative to 100% by mass of nonvolatile components in the resin composition.

(8) The resin composition according to any one of (1) to (7), wherein the component (A) is present in an amount of 5 to 70% by mass relative to 100% by mass of nonvolatile components in the resin composition.

(9) The resin composition according to any one of (1) to (8), wherein the component (B) is present in an amount of 3 to 70% by mass relative to 100% by mass of nonvolatile components in the resin composition.

(10) The resin composition according to any one of (1) to (9), wherein the resin composition further comprises: (C) an inorganic filler.

(11) The resin composition according to (10), wherein the component (C) is present in an amount of 40% or more by mass relative to 100% by mass of nonvolatile components in the resin composition.

(12) The resin composition according to any one of (1) to (11), wherein a glass transition temperature of a cured product thereof is higher than 145° C.

(13) The resin composition according to any one of (1) to (12), wherein a dielectric loss tangent of a cured product thereof is less than 0.005.

(14) A cured product of the resin composition according to any one of (1) to (13).

(15) The cured product according to (14), which has a glass transition temperature higher than 145° C.

(16) The cured product according to (14) or (15), which has a dielectric loss tangent less than 0.005.

(17) A sheet lamination material comprising a resin composition according to any one of (1) to (14).

(18) A resin sheet comprising:

a supporting body; and a resin composition layer formed on the supporting body, the resin composition layer comprising a resin composition according to any one of (1) to (13).

(19) A printed wiring board, comprising an insulating layer formed of a cured product of a resin composition according to any one of (1) to (14).

(20) A semiconductor device, comprising the printed wiring board according to (19).

(21) A method for producing a printed wiring board, comprising a step of forming an insulating layer of the printed wiring board by using a resin composition according to any one of (1) to (13).

Effect of Invention

According to the present invention, provided are: a novel resin composition capable of producing a cured product that is low in the roughness and excellent in the conductor adhesion; and a cured product, a sheet lamination material, a resin sheet, a printed wiring board, and a semiconductor device, methods for producing printed wiring boards or semiconductor devices, all of these being obtained by using this resin composition.

DETAILED DESCRIPTION OF THE INVENTION

Hereinafter, the present invention will be explained in detail on the basis of the preferred embodiments thereof. The present invention is, however, not limited to the embodiments nor to the exemplified materials described below; therefore, the present invention can be carried out with an arbitrary modification thereof so far as the modified embodiments and materials are not outside the claims or the equivalents thereof.

Resin Composition

The resin composition according to the present invention is characterized by inclusion of (A) a naphthol aralkyl type epoxy resin having a weight-average molecular weight (Mw) of 1,000 or more and an epoxy equivalent of 350 g/eq. or more (hereinafter, this is also called "specific epoxy resin"), and (B) a curing agent, in which (B) the curing agent includes (B-1) an active ester type curing agent.

The resin composition according to the present invention including the specific epoxy resin and the active ester type curing agent produces a cured product that is low in the roughness and excellent in the conductor adhesion. In addition, the cured product of the resin composition according to the present invention is excellent in the properties such as a dielectric characteristic, a heat resistance, and a HAST resistance. Accordingly, the resin composition according to the present invention can provide a cured product (insulating layer) having excellent characteristics, so that this can eminently contribute to the nowadays requirements of high functionalities in the printed wiring board and the semiconductor device.

(A) Specific Epoxy Resin

The resin composition according to the present invention includes the specific epoxy resin as the component (A). The specific epoxy resin is the naphthol aralkyl type epoxy resin whose weight-average molecular weight (Mw) and epoxy equivalent are in specific ranges, respectively. The specific epoxy resin may be used singly or as a combination of two or more of these resins with an arbitrary ratio.

Weight-Average Molecular Weight (Mw)

The weight-average molecular weight (Mw) of the specific epoxy resin is 1,000 or more. From a viewpoint to enhance the prescribed effects of the present invention, Mw of the specific epoxy resin is preferably 1,100 or more, and more preferably 1,200 or more, while still more preferably 1,300 or more, or 1,400 or more. The upper limit of Mw of the specific epoxy resin is not particularly restricted; this is usually 200,000 or less, and can be 150,000 or less, 100,000 or less, or 50,000 or less. From a viewpoint to enhance a handling easiness of the resin composition, Mw of the specific epoxy resin is preferably 15,000 or less, and can be 10,000 or less, 5,000 or less, or 4,000 or less. Mw of the specific epoxy resin can be measured as a value in terms of polystyrene by the gel permeation chromatography (GPC) method. The weight-average-molecular weight (Mw) of the specific epoxy resin may be adjusted by removing a low-molecular weight component included in a commercially available product that contains the specific epoxy resin.

Epoxy Equivalent

The epoxy equivalent of the specific epoxy resin is 350 g/eq. or more. From a viewpoint to enhance the prescribed effects of the present invention, the epoxy equivalent of the specific epoxy resin is preferably 352 g/eq. or more, and more preferably 354 g/eq. or more, while still more preferably 355 g/eq. or more, or 356 g/eq. or more. The upper limit of the epoxy equivalent of the specific epoxy resin is not particularly restricted; this is usually 1,000 g/eq. or less, and can be 800 g/eq. or less, 700 g/eq. or less, or 500 g/eq. or less. The epoxy equivalent is the mass of the compound containing one equivalent of the epoxy group. The epoxy equivalent can be measured in accordance with JIS K7236.

From a viewpoint to obtain the prescribed effects of the present invention, it is important to satisfy the above-mentioned ranges in both the weight-average molecular weight (Mw) and the epoxy equivalent. Even if only any one of the weight-average molecular weight (Mw) and the epoxy equivalent satisfies the above-mentioned range, the effects of the present invention cannot be obtained. Therefore, the specific epoxy resin is the naphthol aralkyl type epoxy resin having the weight-average molecular weight (Mw) of 1,000 or more and the epoxy equivalent of 350 g/eq. or more. Accordingly, the specific epoxy resin included in the resin composition according to the present invention is characterized by a comparatively large molecular weight and a specified lower limit of the epoxy equivalent.

Hereinafter, the molecular structure and the like of the specific epoxy resin will be described.

The specific epoxy resin has, in its molecule, one or more of the naphthol aralkyl structure, preferably two or more, and more preferably three or more, while still more preferably four or more. The number of the naphthol aralkyl structure in the molecule of the specific epoxy resin is not particularly restricted so far as the specific epoxy resin satisfies the weight-average molecular weight (Mw) and the epoxy equivalent as described above.

In the specific epoxy resin, it is preferable that the hydrogen atom of the naphthol hydroxy group in the naphthol aralkyl structure be substituted with a substituent selected from the group consisting of: a monovalent group having an epoxy group; and an alkyl group (herein after this substituent is also called "substituent A"). Illustrative examples of the monovalent group having an epoxy group used as the substituent A include an epoxy alkyl group (the number of the carbon atom in the alkyl portion thereof is preferably 1 to 6, and more preferably 1 to 4, while still more preferably 1 or 2); in particular, a glycidyl group is preferable. The number of the carbon atom of the alkyl group used as the substituent A is preferably 1 to 12, more preferably 1 to 6, and still more preferably 1 to 3, while especially preferably 1 (namely, a methyl group). The alkyl group used as the substituent A may be substituted; as specific examples of this substituent include a methyl group, an ethyl group, a propyl group, a n-butyl group, a n-hexyl group, and a cyclohexyl group.

When the total number of the naphthol aralkyl structure included in the specific epoxy resin is assumed to be 100%, the hydrogen atom of the naphthol hydroxy group is substituted with the substituent A with the ratio of preferably 50% or more, more preferably 60% or more, 70% or more, 75% or more, 80% or more, or 90% or more. All (100%) of the hydrogen atom of the naphthol hydroxy group may be substituted with the substituent A. The existence equivalent ratio of the naphthol hydroxy group to the substituent A (naphthol hydroxy group/substituent A) is preferably less than 1, and more preferably nearer to 0, while still more preferably 0.

In one preferable embodiment, (the hydrogen atom of) the naphthol hydroxy group in at least one naphthol aralkyl group included in the specific epoxy resin is substituted with a monovalent group including an epoxy group, and (the hydrogen atom of) the naphthol hydroxy group in at least one (preferably 2 or more) naphthol aralkyl group is substituted with an optionally substituted alkyl group.

In the specific epoxy resin, in addition to the hydroxy group (naphthol hydroxy group) and the monovalent group having the hydrogen atom of this hydroxy group substituted with the substituent A, the naphthalene ring that constitutes the naphthol portion in the naphthol aralkyl structure may or not further have a substituent at the position other than this hydroxy group and so forth (hereinafter, this substituent is also called "substituent B"). Illustrative examples of the substituent B include a monovalent group containing an epoxy group, an alkyl group having 1 to 12 carbon atoms, an allyl group, or an aryl group having 6 to 10 carbon atoms. The alkyl group and aryl group used as the substituent B may be optionally substituted; illustrative examples of these substituents (hereinafter, they are also called "substituent C") include a methyl group, an ethyl group, a propyl group, a n-butyl group, a n-hexyl group, and a cyclohexyl group.

In the specific epoxy resin, the aralkyl portion in the naphthol aralkyl structure is formed by directly bonding an arylene group with two alkylene group. The arylene group is preferably an optionally substituted arylene group having 6 to 20 carbon atoms. Specific examples of the arylene group include a phenylene group, a 1-naphthylene group, and a 2-naphtylene group. The substituent optionally possessed by the arylene group is preferably the substituent B. The alkylene group is preferably an alkylene group having 1 to 12 carbon atoms. The alkylene group may optionally have a substituent. When the alkylene group has the substituent, the substituent is preferably the substituent C.

In the naphthol portion in the naphthol aralkyl structure, the monovalent group having the naphthol hydroxy group or the hydrogen atom thereof substituted with the substituent A is preferably at the α-position of the naphthalene ring (namely, 1, 4, 5, or 8 position). The substituent B optionally possessed by the naphthalene ring may be at any position on the naphthalene ring against the monovalent group having the naphthol hydroxy group at the α-position or the hydrogen atom thereof substituted with the substituent A.

Although the specific epoxy resin, namely the component (A), is not particularly restricted so far as the weight-average molecular weight (MW) and the epoxy equivalent satisfy the above-mentioned ranges, it is preferable that this include the compound represented by the following formula (A1):

(A1)

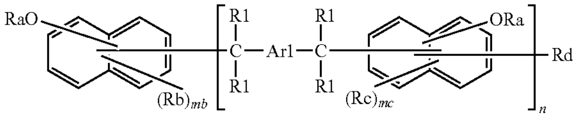

(In the formula (A1), Ar1 is an optionally substituted arylene group having 6 to 20 carbon atoms; each Ra independently represents a hydrogen atom, a monovalent group having an epoxy group, or an alkyl group having 1 to 12 carbon atoms, in which at least one Ra is the monovalent group having an epoxy group, and at least one Ra is the alkyl group having 1 to 12 carbon atoms; Rb and Rc each independently represent a monovalent group having an epoxy group, an alkyl group having 1 to 12 carbon atoms, an allyl group, or an aryl group having 6 to 10 carbon atoms; Rd represents a hydrogen atom, a monovalent group having an epoxy group, an alkyl group having 1 to 12 carbon atoms, an allyl group, or an aryl group having 6 to 10 carbon atoms; each R1 independently represents a hydrogen atom or an alkyl group having 1 to 12 carbon atoms; and n represents an integer of 2 to 50, mb represents an integer of 0 to 6, and mc represents an integer of 0 to 5).

In the formula (A1), Ar1 is an optionally substituted arylene group having 6 to 20 carbon atoms. Illustrative examples of the arylene group having 6 to 20 carbon atoms include a phenylene group, a 1-naphthylene group, and 2-naphthylene group. The number of the carbon atoms in the arylene group is preferably 6 to 14, and more preferably 6 to 10, while typically 6 (namely a phenylene group).

Illustrative examples of the substituent optionally possessed by the arylene group include an alkyl group having 1 to 6 carbon atoms, an alkoxy group having 1 to 6 carbon atoms, and an aryl group having 1 to 10 carbon atoms. Among them, an alkyl group having 1 to 6 carbon atoms is preferable, and an alkyl group having 1 to 3 carbon atoms is more preferable. Illustrative examples of the aryl group include a phenyl group, a 1-naphtyl group, and a 2-naphtyl group.

In the formula (A1), each Ra independently represents a hydrogen atom, a monovalent group having an epoxy group, or an alkyl group having 1 to 12 carbon atoms. Here, in the formula (A1), at least one Ra is the monovalent group having an epoxy group, and at least one Ra is the alkyl group having 1 to 12 carbon atoms. When Ra is the monovalent group having an epoxy group, this monovalent group may be an epoxy alkyl group (the number of the carbon atom in the alkyl portion thereof is preferably 1 to 6, and more preferably 1 to 4, while still more preferably 1 or 2); in particular, a glycidyl group is preferable. When Ra is the alkyl group, the number of the carbon atom thereof is preferably 1 to 6, and more preferably 1 to 3, while still more preferably 1 (namely, a methyl group). When Ra is the alkyl group, this may be optionally substituted, preferably with the substituent C. When the number n+1 of the repeating unit (naphthol aralkyl group) included in the compound represented by the formula (A1) is assumed to be 100%, the hydrogen atoms of the naphthol hydroxy group are substituted with the substituent Ra in the number, preferably 50% or more, more preferably 60% or more, 70% or more, 75% or more, 80% or more, or 90% or more of, and all of the hydrogen atoms of the naphthol hydroxy group in the number (namely 100%) may be substituted with the substituent Ra. The existence equivalent ratio of the naphthol hydroxy group to the substituent Ra (naphthol hydroxide group/substituent Ra) is preferably 1 or less, and more preferably nearer to 0, while still more preferably 0.

In the formula (A1), Rb and Rc each independently represent a monovalent group having an epoxy group, an alkyl group having 1 to 12 carbon atoms, an allyl group, or an aryl group having 6 to 10 carbon atoms. When Rb or Rc is the monovalent group having an epoxy group, the monovalent group is preferably an epoxyalkyloxy group (the number of the carbon atom in the alkyl portion thereof is preferably 1 to 6, and more preferably 1 to 4, while still more preferably 1 or 2); among them, a glycidyloxy group is preferable. When Rb or Rc is the alkyl group, the number of the carbon atom thereof is preferably 1 to 6, and more preferably 1 to 3, while still more preferably 1 (namely, a methyl group). When Rb or Rc is the aryl group, the number of the carbon atom thereof is preferably 6 to 10 (for example, a phenyl group, a 1-naphthyl group, or a 2-naphthyl group), while more preferably 6. Preferably Rb and Rc each are independently an alkyl group having 1 to 12 carbon atoms, while more preferably a methyl group. When Rb or Rc is the alkyl group or the aryl group, they may be substituted; when substituted, the number of the substituent group may be one or more, and preferably the substituents each are independently the substituent C. Here, Rb and Rc are the substituents directly bonded to the naphthalene ring.

In the formula (A1), Rd represents a hydrogen atom, a monovalent group having an epoxy group, an alkyl group having 1 to 12 carbon atoms, an allyl group, or an aryl group having 6 to 10 carbon atoms. Preferably, Rd is the same as any of the group represented by Rb or a hydrogen atom. Also, Rd is preferably a hydrogen atom or an alkyl group having 1 to 12 carbon atoms, while more preferably a hydrogen atom. When Rd is the alkyl group or the aryl group, this may be substituted; when substituted, the number of the substituent may be one, or two or more, while the substituent C is preferable. Here, Rd means the substituent that is directly bonded to the naphthalene ring.

In the formula (A1), each R1 independently represents a hydrogen atom or an alkyl group having 1 to 12 carbon atoms. All of a plurality of R1 are preferably a hydrogen atom. When R1 is the alkyl group, the number of the carbon atoms thereof is preferably 1 to 6, and more preferably 1 to 3, while still more preferably 1. Preferably, two of R1 constitute, together with the carbon atom bonded thereto, an alkylene group having 1 to 3 carbon atoms; in this case, specific example thereof is any of $—CH_2—$, $—CH(CH_3)—$, and $—C(CH_3)_2—$. When R1 is the alkyl group, this may be substituted, and when substituted, the number of the substituent group may be one, or two or more, and preferably the substituents each are independently the substituent C.

In the formula (A1), n represents an integer of 2 to 50. When seeing the component (A) as a whole, although there is no restriction in n so far as the before-mentioned range of the weight-average molecular weight (Mw) is satisfied, from a viewpoint to obtain a cured product having a high heat resistance, n is preferably an integer of 2 or more, and more preferably an integer of 3 or more, while still more preferably an integer of 4 or more. In one embodiment, n is 4 or more, and at least two Ra in the formula (A1) are an alkyl group having 1 to 6 carbon atoms.

In the formula (A1), mb represents an integer of 0 to 6. Preferably mb is an integer of 0 to 3. In the formula (A1), mc represents an integer of 0 to 5. Preferably mc is an integer of 0 to 2. The sum of mb an mc is preferably 7 or less, or 6 or less, and more preferably in the range of 0 to 5, while still more preferably in the range of 0 to 4. In one embodiment, both mb and mc are 0, and Rd is a hydrogen atom.

More preferably, the component (A) includes the compound represented by the following formula (A2).

(A2)

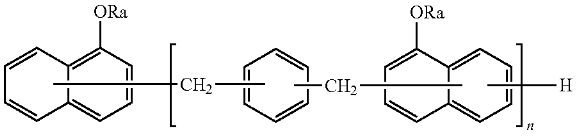

(In the formula (A2), Ra and n are the same as Ra and n, respectively, in the formula (A1)). In one embodiment, n is 4 or more and at least two Ra in the formula (A2) are an alkyl group having 1 to 6 carbon atoms.

The specific epoxy resin can be produced, for example, in accordance with a heretofore known method. For example, in accordance with the method described in Japanese Patent Application Laid-open No. H08-073570, which is incorporated herein by reference in its entirety, a naphthol aralkyl resin is produced by using a naphthol as the material having a phenolic hydroxy group, then, as needed, part of the hydroxy groups on the naphthalene ring are alkoxylated in accordance with the method described in Japanese Patent No. 4465257, or by using a commercially available naphthol aralkyl resin having the weight-average molecular weight of 1,000 or more (for example, "SN-4110V", manufactured by NIPPON STEEL Chemical & Material Co., Ltd.), part or all of the rest of the hydroxy groups thereof are glycidylated, followed by purification as needed. A commercially available product including the compound represented by the formula (A1) or the formula (A2) may be used as the specific epoxy resin. Examples of the commercially available compound like this may include "ESN-4100V" (methoxy-containing naphthol aralkyl resin; epoxy equivalent of 360 g/eq.; weight-average molecular weight (Mw) of 1,600) manufactured by NIPPON STEEL Chemical & Material Co., Ltd.

A content of the component (A) in the resin composition is not particularly restricted; but from a viewpoint to enhance the prescribed effects of the present invention, the content is, relative to 100% by mass of the nonvolatile components in the resin composition, preferably 5% or more by mass, and more preferably 7% or more by mass, while still more preferably 10% or more by mass, and preferably 70% or less by mass, and more preferably 65% or less by mass, while still more preferably 60% or less by mass, or 50% or less by mass. Accordingly, in one preferable embodiment, the content of the component (A) is in the range of 5 to 70% by mass relative to 100% by mass of the nonvolatile components in the resin composition.

A content of the component (A) in the resin composition is not particularly restricted; but from a viewpoint to enhance the prescribed effects of the present invention, the content is, relative to 100% by mass of resin components in the resin composition, preferably 7.5% or more by mass, and more preferably 10% or more by mass, while still more preferably 15% or more by mass, and preferably 95% or less by mass, and more preferably 85% or less by mass, while still more preferably 80% or less by mass, or 75% or less by mass. The resin components in the resin composition means the components except for (C) an inorganic filler in the nonvolatile components in the resin composition.

(B) Curing Agent

The resin composition according to the present invention includes a curing agent as the component (B), which includes at least (B-1) an active ester type curing agent. In general, (B) the curing agent can have a function to cure the resin composition by reacting with the component (A) and an epoxy resin other than the component (A). The curing agent may include, in addition to the active ester type curing agent, (B-2) a curing agent other than the active ester type curing agent.

(B-1) Active Ester Type Curing Agent

The resin composition according to the present invention includes (B-1) the active ester type curing agent. In general, (B-1) the active ester type curing agent can have a function to cure the resin composition by reacting with (B) the epoxy resin. (B-1) The active ester type curing agent may be used singly or as a combination of two or more of the curing agents with an arbitrary ratio.

In general, compounds having, as a reactive functional group, two or more ester groups having a high reactivity in one molecule can be preferably used as (B-1) the active ester type curing agent; these esters being a phenol ester, a thiophenol ester, an N-hydroxylamine ester, an ester of a heterocyclic hydroxy compound, and the like. The active ester type curing agent is preferably the compound that is obtained by a condensation reaction of a carboxylic acid compound and/or a thiocarboxylic acid compound with a hydroxy compound and/or a thiol compound. In particular, from a viewpoint to obtain a cured product having an excellent heat resistance, the active ester type curing agent obtained from a carboxylic acid compound and a hydroxy compound is preferable, while the active ester type curing agent obtained from a carboxylic acid compound and a phenol compound and/or a naphthol compound is more preferable. Illustrative examples of the carboxylic acid compound include benzoic acid, acetic acid, succinic acid, maleic acid, itaconic acid, phthalic acid, isophthalic acid, terephthalic acid, and pyromellitic acid. Illustrative examples of the phenol compound or the naphthol compound include hydroquinone, resorcin, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxy naphthalene, 1,6-dihydroxy naphthalene, 2,6-dihydroxy naphthalene, dihydroxy benzophenone, trihydroxy benzophenone, tetrahydroxy benzophenone, phloroglucin, benzene triol, a dicyclopentadiene type diphenol compound, and phenol novolak. Here, the "dicyclopentadiene type diphenol compound" means the diphenol compound obtained by condensation of one dicyclopentadiene molecule with two phenol molecules.

Specifically, as (B-1) the active ester type curing agent, preferable are a dicyclopentadiene type active ester type curing agent, a naphthalene type active ester type curing agent containing a naphthalene structure, an active ester type curing agent containing an acetylated phenol novolak, and an active ester type curing agent containing a benzoylated phenol novolak. Among these, at least one curing agent selected from the dicyclopentadiene type active ester type curing agent and the naphthalene type active ester type curing agent is more preferable. As for the dicyclopentadiene type active ester type curing agent, an active ester type curing agent containing a dicyclopentadiene type diphenol structure is preferable. Here, the "dicyclopentadiene type diphenol structure" means a divalent structure unit formed of phenylene-dicyclopentylene-phenylene.

Illustrative examples of the commercially available product of (B-1) the active ester type curing agent include: as the active ester type curing agent containing a dicyclopentadiene type diphenol structure, "EXB9451", "EXB9460", "EXB9460S", "EXB-8000L", "EXB-8000L-65M", "EXB-8000L-65TM", "HPC-8000L-65TM", "HPC-8000", "HPC-8000-65T", "HPC-8000H", and "HPC-8000H-65TM" (all of these are manufactured by DIC Corp.); as the active ester type curing agent containing a naphthalene structure, "EXB-8100L-65T", "EXB-8150-60T", "EXB-8150-62T", "EXB-9416-70BK", "HPC-8150-60T", and "HPC-8150-62T" (all of these are manufactured by DIC Corp.); as the active ester type curing agent containing phosphorous, "EXB9401" (manufactured by DIC Corp.); as the active ester type curing agent containing an acetylated phenol novolak, "DC808" (manufactured by Mitsubishi Chemical Corp.); as the active ester type curing agent containing a benzoylated phenol novolak, "YLH1026", "YLH1030", and "YLH1048" (all of these are manufactured by Mitsubishi Chemical Corp.); and as the active ester type curing agent containing a styryl group and a naphthalene structure, "PC1300-02-65MA" (manufactured by Air Water Inc.).

The equivalent of the reactive functional group of (β-1) the active ester type curing agent is preferably in the range of 50 to 500 g/eq., and more preferably in the range of 50 to 450 g/eq., while still more preferably in the range of 100 to 300 g/eq. The equivalent of the reactive functional group is the mass of the compound per 1 equivalent of the reactive functional group.

From a viewpoint to obtain the cured product having an excellent dielectric characteristic, the content of the component (B-1) in the resin composition is, relative to 100% by mass of the nonvolatile components in the resin composition, preferably 3% or more by mass, and more preferably 4% or more by mass, while still more preferably 5% or more by mass. The upper limit thereof can be, for example, 50% or less by mass, 40% or less by mass, or 30% or less by mass, although these values are different dependent on the total number of the epoxy groups possessed by the epoxy resin to be cured. Accordingly, in one preferable embodiment, the content of the component (B-1) is in the range of 3 to 50% by mass relative to 100% by mass of the nonvolatile components in the resin composition.

The percentage mass ratio of the component (B-1) to the component (A) ((B-1) component/(A) component) can be, for example, 5% or more by mass, 10% or more by mass, 20% or more by mass, or 30% or more by mass, and 75% or less by mass, 70% or less by mass, or 65% or less by mass, although these values are different depending on the total number of the functional group.

From a viewpoint to obtain the cured product having an excellent dielectric characteristic, the percentage mass ratio of the component (B-1) to the component (B) ((B-1) component/(B) component) is preferably 50% or more by mass, and more preferably 60% or more by mass, while still more preferably 70% or more by mass. The upper limit thereof is 100% by mass, and can be, for example, 98% or less by mass, 96% or less by mass, or 94% or less by mass.

(B-2) Curing Agent Other Than Active Ester Type Curing Agent

Illustrative examples of (B-2) the curing agent other than the active ester type curing agent include a phenol type curing agent, a naphthol type curing agent, a benzoxazine type curing agent, a cyanate ester type curing agent, a carbodiimide type curing agent, and an acid anhydride type curing agent. Among these, from a viewpoint to eminently obtain the effects of the present invention, among these, the component (B-2) includes preferably any one or more of the phenol type curing agent, the naphthol type curing agent, the cyanate ester type curing agent, and the carbodiimide type curing agent, and more preferably any one or more of the phenol type curing agent and the naphthol type curing agent, while especially preferably the phenol type curing agent. The component (B-2) may be used singly or as a combination of two or more of these curing agents with an arbitrary ratio.

From a viewpoint of the heat resistance and the water resistance, a phenol type curing agent having a novolak structure or a naphthol type curing agent having a novolak structure is preferable as the phenol type curing agent and the naphthol type curing agent. From a viewpoint of adhesion with a conductive layer, a nitrogen-containing phenol type curing agent is preferable, and a phenol type curing agent containing a triazine skeleton is more preferable.

Specific examples of the phenol type curing agent and the naphthol type curing agent include “MEH-7700”, “MEH-7810”, and “MEH-7851”, all of these being manufactured by Meiwa Plastic Industries, Ltd.; “NHN”, “CBN”, and “GPH”, all of these being manufactured by Nippon Kayaku Co., Ltd.; “SN170”, “SN-180”, “SN-190”, “SN-475”, “SN-485”, “SN-495”, “SN-495V”, “SN-375”, and “SN-395”, all of these being manufactured by NIPPON STEEL Chemical & Material Co., Ltd.; and “TD-2090”, “LA-7052”, “LA-7054”, “LA-1356”, “LA3018-50P”, and “EXB-9500”, all of these being manufactured by DIC Corp.

Specific examples of the benzoxazine type curing agent include “JBZ-OP100D” and “ODA-BOZ”, which are manufactured by JFE Chemical Corp., “HFB2006M” manufactured by Showa Highpolymer Co., Ltd., and “P-d” and “F-a”, which are manufactured by Shikoku Chemicals Corp.

Illustrative examples of the cyanate ester type curing agent include: bifunctional cyanate resins such as bisphenol A dicyanate, polyphenol cyanate, oligo(3-methylene-1,5-phenylenecyanate), 4,4'-methylenebis(2,6-dimethylphenylcyanate), 4,4'-ethylidene diphenyl dicyanate, hexafluorobisphenol A dicyanate, 2,2-bis(4-cyanate)phenylpropane, 1,1-bis(4-cyanatephenylmethane), bis(4-cyanate-3,5-dimethylphenyl)methane, 1,3-bis(4-cyanatephenyl-1-(methylethylidene))benzene, bis(4-cyanatephenyl) thioether, and bis(4-cyanatephenyl) ether; polyfunctional cyanate resins derived from a phenol novolak, a cresol novolak, and the like; and a prepolymer having these cyanate resins partially triazinated. Specific examples of the cyanate ester type curing agent include “PT30” and “PT60” (both are phenol novolak type polyfunctional cyanate ester resins); “ULL-950S” (polyfunctional cyanate ester resin);

and “BA230” and “BA230S75” (both are prepolymers in which part or all of bisphenol A dicyanate is triazinated to be a trimer); all of these curing agents being manufactured by Lonza Japan Ltd.

Specific examples of the carbodiimide type curing agent include “V-03” and “V-07”; both are manufactured by Nisshinbo Chemical, Inc.

The acid anhydride type curing agent may be a curing agent having one or more acid anhydride groups in one molecule thereof, and a curing agent having two or more acid anhydride groups in one molecule thereof is preferable. Specific examples of the acid anhydride type curing agent include phthalic anhydride, tetrahydrophthalic anhydride, hexahydrophthalic anhydride, methyl tetrahydrophthalic anhydride, methyl hexahydrophthalic anhydride, methyl nadic anhydride, hydrogenated methyl nadic anhydride, a trialkyl tetrahydrophthalic anhydride, dodecenylsuccinic anhydride, 5-(2,5-dioxotetrahydro-3-furanyl)-3-methyl-3-cyclohexene-1,2-dicarboxylic anhydride, trimellitic anhydride, pyromellitic anhydride, benzophenone tetracarboxylic dianhydride, biphenyl tetracarboxylic dianhydride, naphthalene tetracarboxylic dianhydride, oxydiphthalic dianhydride, 3,3'-4,4'-diphenylsulfone tetracarboxylic dianhydride, 1,3,3a,4,5,9b-hexahydro-5-(tetrahydro-2,5-dioxo-3-furanyl)-naphto[1,2-C]furan-1,3-dione, ethyleneglycol bis (anhydrotrimellitate), and a polymer type acid anhydride such as a styrene-maleic acid resin, which is a copolymer of styrene and maleic acid. Illustrative examples of the commercially available acid anhydride type curing agent include “HNA-100” and “MH-700”, which are manufactured by New Japan Chemical Co., Ltd.

From a viewpoint to obtain the cured product having the excellent dielectric characteristic, the content of the component (B-2) in the resin composition is, relative to 100% by mass of the nonvolatile components in the resin composition, preferably 20% or less by mass, and more preferably 15% or less by mass, while still more preferably 10% or less by mass. The lower limit thereof is 0% by mass (namely, not included at all). Although there is no particular restriction, the lower limit can be 2% or more by mass, 4% or more by mass, or 6% or more by mass. It is preferable that the content of the component (B-2) be less than the content of the component (B-1).

The ratio of the total number $N_b$ of the reactive functional group possessed by the component (B) to the total number $N_a$ of the epoxy group possessed by the component (A) ($N_b$:$N_a$) is preferably in a specific range. In general, the reactive functional group possessed by the component (B) means the group capable of undergoing the reaction with an epoxy group; here, this functional group includes a group capable of giving the group that can react with the epoxy group by heating or the like. Therefore, the reactive functional group includes the active ester group possessed by the component (B-1). The ratio ($N_b$:$N_a$) is preferably 0.2 or more, and more preferably 0.3 or more, while especially preferably 0.4 or more, and preferably 100 or less, and more preferably 90 or less, while especially preferably 80 or less. “Total number $N_b$” means the value obtained by summing up all the values that are obtained by dividing the mass of the nonvolatile components in the component (B) present in the resin composition with the equivalent of the reactive functional group. When the ratio ($N_b$:$N_a$) is within the above-mentioned range, the effects of the present invention can be eminently obtained. Accordingly, in one preferable embodiment, the ratio of the total number of the reactive functional group possessed by the component (B) to the total number of the epoxy group possessed by the component (A) is in the range of 0.2 to 100.

The percentage mass ratio of the component (B) to the component (A) ((B) component/(A) component) can be, for example, 5% or more by mass, 10% or more by mass, 20% or more by mass, or 30% or more by mass, and 100% or less by mass, 90% or less by mass, or 80% or less by mass, although these ranges are different dependent on the total number of the functional group.

From a viewpoint to enhance the prescribed effects of the present invention, the content of the component (B) in the resin composition is, relative to 100% by mass of the nonvolatile components in the resin composition, preferably 3% or more by mass, and more preferably 4% or more by mass, while still more preferably 5% or more by mass. The upper limit thereof can be, for example, 70% or less by mass, 60% or less by mass, or 50% or less by mass, although the upper limit is different dependent on the total number of the epoxy group possessed by the epoxy resin to be cured. In one preferable embodiment, the content of the component (β-1) is in the range of 3 to 70% by mass relative to 100% by mass of the nonvolatile components in the resin composition.

(C) Inorganic Filler

The resin composition according to the present invention may further include an inorganic filler as the component (C). The resin composition including the component (C) can give the cured product having an excellent heat resistance (for example, glass transition temperature).

Illustrative examples of the component (C) include silica, alumina, glass, cordierite, silicon oxide, barium sulfate, barium carbonate, talc, clay, mica powder, zinc oxide, hydrotalcite, boehmite, aluminum hydroxide, magnesium hydroxide, calcium carbonate, magnesium carbonate, magnesium oxide, boron nitride, aluminum nitride, manganese nitride, aluminum borate, strontium carbonate, strontium titanate, calcium titanate, magnesium titanate, bismuth titanate, titanium oxide, zirconium oxide, barium titanate, barium titanate zirconate, barium zirconate, calcium zirconate, zirconium phosphate, and zirconium phosphate tungstate. Among these, silica is especially preferable. Illustrative examples of the silica include amorphous silica, fused silica, crystalline silica, synthesized silica, and hollow silica. Spherical silica is preferable as the silica. The component (C) may be used singly or as a combination of two or more of these fillers.

Illustrative examples of the commercially available product of the component (C) include "UFP-30" manufactured by Denka Co., Ltd.; "SP60-05" and "SP507-05" manufactured by NIPPON STEEL Chemical & Material Co., Ltd.; "YC100C", "YA050C", YA050C-MJE", and "YA010C" manufactured by Admatechs Co., Ltd.; "UFP-30" manufactured by Denka Co., Ltd.; "Silfil NSS-3N", "Silfil NSS-4N", and "Silfil NSS-5N" manufactured by Tokuyama Corp.; "SC2500SQ", "SO-C4", "SO-C2", and "SO-C1" manufactured by Admatechs Co., Ltd.; and "DAW-03" and "FB-105FD" manufactured by Denka Co., Ltd.

Although the average particle diameter of the component (C) is not particularly restricted, this is preferably 10 μm or less, and more preferably 5 μm or less, while still more preferably 3 μm or less, 2 μm or less, 1 μm or less, or 0.7 μm or less. Although the lower limit of the average particle diameter thereof is not particularly restricted, this is preferably 0.01 μm or more, and more preferably 0.05 μm or more, while still more preferably 0.07 μm or more, 0.1 μm or more, or 0.2 μm or more. The average particle diameter of the component (C) can be measured with a laser diffraction scattering method based on the Mie scattering theory. Specifically, the particle diameter distribution of the inorganic filler on the volume basis is prepared by using a laser diffraction scattering type particle diameter distribution measurement apparatus. The average particle diameter thereof can be measured as a median diameter. A measurement sample obtained by weighing 100 mg of the inorganic filler and 10 g of methyl ethyl ketone into a vial bottle followed by dispersing the resulting mixture with ultrasonic waves for 10 minutes may be used. This measurement sample was measured by using the laser diffraction type particle diameter distribution measurement instrument with a blue light and a red light of a light source wavelength using a flow cell method to obtain the particle diameter distribution of the inorganic filler on the volume basis; then, from the thereby obtained particle diameter distribution, the average particle diameter was calculated as the median diameter. Illustrative examples of the laser diffraction type particle diameter distribution measurement instrument include "LA-960" manufactured by Horiba Ltd.

Although the specific surface area of the component (C) is not particularly restricted, this is preferably 0.1 $m^2/g$ or more, and more preferably 0.5 $m^2/g$ or more, while still more preferably 1 $m^2/g$ or more, 3 $m^2/g$ or more, or 5 $m^2/g$ or more. Although the upper limit of the specific surface area thereof is not particularly restricted, this is preferably 100 $m^2/g$ or less, and more preferably 80 $m^2/g$ or less, while still more preferably 60 $m^2/g$ or less, 50 $m^2/g$ or less, or 40 $m^2/g$ or less. The specific surface area of the component (C) can be measured by adsorbing a nitrogen gas onto a sample surface in accordance with the BET method using the specific surface area measurement instrument ("Macsorb HM-1210"; manufactured by Mountech Co., Ltd.); then, the specific surface area can be obtained by calculation by the BET multipoint method.

It is preferable that the component (C) be surface-modified by a suitable surface modifying agent. With the surface modification, the humidity resistance and dispersion property of the component (C) can be enhanced. Illustrative examples of the surface modifying agent include: silane coupling agents such as a vinyl type silane coupling agent, an epoxy type silane coupling agent, a styryl type silane coupling agent, a (meth)acryl type silane coupling agent, an amino type silane coupling agent, an isocyanurate type silane coupling agent, a ureido type silane coupling agent, a mercapto type silane coupling agent, an isocyanate type silane coupling agent, and an acid anhydride type silane coupling agent; non-silane coupling-alkoxysilane compounds such as methyl trimethoxy silane and phenyl trimethoxy silane; and a silazane compound. These surface modifying agents may be used singly or as a combination of two or more of them.

Illustrative examples of the commercially available surface modifying agent include "KBM403" (3-glycidoxypropyl trimethoxy silane) manufactured by Shin-Etsu Chemical Co., Ltd.; "KBM803" (3-mercaptopropyl trimethoxy silane) manufactured by Shin-Etsu Chemical Co., Ltd.; "KBE903" (3-aminopropyl triethoxy silane) manufactured by Shin-Etsu Chemical Co., Ltd.; "KBM573" (N-phenyl-3-aminopropyl trimethoxy silane) manufactured by Shin-Etsu Chemical Co., Ltd.; and "SZ-31" (hexamethyl disilazane) manufactured by Shin-Etsu Chemical Co., Ltd.

From a viewpoint to enhance the dispersibility of the inorganic filler, surface modification by the surface modifying agent is done preferably to the degree within a prescribed range. Specifically, it is preferable that 100% by mass of the inorganic filler be surface-modified with 0.2 to 5% by mass of the surface modifying agent.

The degree of surface modification by the surface modifying agent may be evaluated by the carbon amount per unit surface area of the inorganic filler. From a viewpoint to enhance the dispersibility of the inorganic filler, the carbon amount per unit surface area of the inorganic filler is preferably 0.02 $mg/m^2$ or more, and more preferably 0.1 $mg/m^2$ or more, while still more preferably 0.2 $mg/m^2$ or more. On the other hand, from a viewpoint to prevent the increase in the melt viscosity of the resin composition or the melt viscosity in the state of a sheet, this carbon amount is preferably 1.0 $mg/m^2$ or less, and more preferably 0.8 $mg/m^2$ or less, while still more preferably 0.5 $mg/m^2$ or less. The carbon amount per unit surface area of the component (C) can be measured after the inorganic filler whose surface has been modified is cleaned by a solvent (for example, methyl ethyl ketone (MEK)). Specifically, after a sufficient amount of MEK as the solvent is added to the inorganic filler whose surface has been modified with a surface modifying agent, the resulting mixture is cleaned by ultrasonic cleaning at 25° C. for 5 minutes. The supernatant solution thereof is removed; and then, after the solid component remained is dried, the carbon amount per unit surface area of the inorganic filler can be measured by using a carbon analysis apparatus. As the carbon analysis apparatus, such as "EMIA-320V" manufactured by Horiba Ltd., and the like can be used.

From a viewpoint to enhance the prescribed effects of the present invention, the content of the component (C) in the resin composition is, relative to 100% by mass of the nonvolatile components in the resin composition, preferably 40% or more by mass, and more preferably 45% or more by mass, while still more preferably 50% or more by mass, or 55% or more by mass. The upper limit of the content of the component (C) is not particularly restricted; this is determined depending on the contents of the component (A) and the component (B). Accordingly, in one preferable embodiment, the content of the component (C) is 40% or more by mass relative to 100% by mass of the nonvolatile components in the resin composition.

(D) Thermoplastic Resin

The resin composition according to the present invention may further include a thermoplastic resin as the component (D).

Illustrative examples of the component (D) include a phenoxy resin, a polyimide resin, a polycarbonate resin, a polyvinyl acetal resin, a polyolefin resin, a polyamide imide resin, a polyether imide resin, a polysulfone resin, a polyether sulfone resin, a polyphenylene ether resin, a polyether ether ketone resin, a polystyrene resin, and a polyester resin. In particular, from a viewpoint to obtain the cured product having the excellent dielectric characteristic, it is preferable that the component (D) include one or more resins selected from the phenoxy resin, the polyimide resin, and the polycarbonate resin; more preferable is to include one or more selected from the phenoxy resin.

Illustrative examples of the phenoxy resin include phenoxy resins having one or more skeletons selected from the group consisting of a bisphenol A skeleton, a bisphenol F skeleton, a bisphenol S skeleton, a bisphenol acetophenone skeleton, a novolak skeleton, a biphenyl skeleton, a fluorene skeleton, a dicyclopentadiene skeleton, a norbornene skeleton, a naphthalene skeleton, an anthracene skeleton, an adamantane skeleton, a terpene skeleton, and a trimethyl cyclohexane skeleton. The terminal of the phenoxy resin may be any functional group including a phenolic hydroxy group and an epoxy group.

Illustrative examples of the commercially available phenoxy resin include: "1256" and "4250" (both are phenoxy resins having a bisphenol A skeleton) manufactured by Mitsubishi Chemical Corp.; "YX8100" (a phenoxy resin having a bisphenol S skeleton) manufactured by Mitsubishi Chemical Corp.; "YX6954" (a phenoxy resin having a bisphenol acetophenone skeleton) manufactured by Mitsubishi Chemical Corp.; "FX280" and "FX293" manufactured by NIPPON STEEL Chemical & Material Co., Ltd.; and "YL7500BH30", "YX6954BH30", "YX7553", "YX7553BH30", "YL7769BH30", "YL6794", "YL7213", "YL7290", and "YL7482" manufactured by Mitsubishi Chemical Corp.

As the polyimide resin, a resin having an imide structure can be used. In general, the polyimide resin can be obtained by an imidation reaction of a diamine compound with an acid anhydride. A commercially available polyimide resin may be used. Illustrative examples thereof include "RIKACOAT SN20" and "RIKACOAT PN20" manufactured by New Japan Chemical Co., Ltd.

The polycarbonate resin is the resin having a carbonate structure. Illustrative examples of the resin like this include a carbonate resin not having a reactive group described hereinafter, as well as a carbonate resin having a hydroxy group, a carbonate resin having a phenolic hydroxy group, a carbonate resin having a carboxy group, a carbonate resin having an acid anhydride group, a carbonate resin having an isocyanate group, a carbonate resin having a urethane group, and a carbonate resin having an epoxy group. Here, the reactive group means the functional group capable of undergoing a reaction with other components such as a hydroxy group, a phenolic hydroxy group, a carboxy group, an acid anhydride group, an isocyanate group, a urethane group, and an epoxy group.

As for the polycarbonate resin, a commercially available product may be used. Illustrative examples of the commercially available product include: "FPC0220" and "FPC2136" manufactured by Mitsubishi Gas Chemical Company, Inc.; "T6002" and "T6001" (polycarbonate diol) manufactured by Asahi Kasei Chemicals Corp.; and "C-1090", "C-2090", and "C-3090" (polycarbonate diol) manufactured by Kuraray Co., Ltd.

From a viewpoint to obtain the cured product having further improved mechanical characteristics, the weight-average molecular weight (Mw) of the component (D) is preferably 5,000 or more, and more preferably 8,000 or more, while still more preferably 10,000 or more. Although the upper limit of Mw is not particularly restricted, this is preferably 100,000 or less, and more preferably 80,000 or less, while still more preferably 50,000 or less. Here, Mw of the component (D) can be measured as a value in terms of polystyrene by the gel permeation chromatography (GPC) method.

When the resin composition includes the component (D), from a viewpoint to obtain the cured product having further improved mechanical characteristics, the content of the component (D) in the resin composition is, relative to 100% by mass of the nonvolatile components in the resin composition, preferably 0.1% or more by mass, and more preferably 0.3% or more by mass, while still more preferably 0.5% or more by mass. The upper limit of the content of the component (D) is not particularly restricted so far as the effects of the present invention is not excessively impaired; so, this can be, for example, 60% or less by mass, 50% or less by mass, or 45% or less by mass. In one embodiment, the content of the component (D) is less than the sum of the content of the component (A) and the content of the component (B).

(E) Curing Facilitator

The resin composition according to the present invention may further include a curing facilitator or accelerator as the component (E). When the resin composition includes (E) the curing facilitator, the curing time and the like can be efficiently controlled. Illustrative examples of the curing facilitator as the component (E) include an amine type curing facilitator, a peroxide type curing facilitator, a phosphorous type curing facilitator, an imidazole type curing facilitator, a guanidine type curing facilitator, and a metal type curing facilitator. Typical examples thereof are the amine type curing facilitator and the peroxide type curing facilitator.

Illustrative examples of the amine type curing facilitator include: trialkyl amines such as triethylamine and tributylamine; 4-dimethylaminopyridine (DMAP), benzyl dimethylamine, 2,4,6-tris(dimethylaminomethyl)phenol, 1,8-diazbicyclo(5,4,0)-undecene, 1,8-diazbicyclo[5,4,0]undecene-7,4-dimethlaminopyridine, and 2,4,6-tris(dimethylaminomethyl)phenol. Among these, 4-dimethylaminopyridine and 1,8-diazbicyclo(5,4,0)-undecene are preferable. Illustrative examples of the commercially available amine type curing facilitator include "DMAP" manufactured by Wako Pure Chemical Industries, Ltd.

Illustrative examples of the peroxide type curing facilitator include t-butylcumyl peroxide, t-butylperoxy acetate, α,α'-di(t-butylperoxy)diisopropylbenzene, t-butylperoxy laurate, t-butylperoxy-2-ethyl hexanoate, t-butylperoxy neodecanoate, and t-butylperoxy benzoate.

Illustrative examples of the commercially available peroxide type curing facilitator include "PERBUTYL (registered trademark) C", "PERBUTYL (registered trademark) A", "PERBUTYL (registered trademark) P", "PERBUTYL (registered trademark) L", "PERBUTYL (registered trademark) O", "PERBUTYL (registered trademark) ND", "PERBUTYL (registered trademark) Z", "PERHEXYL (registered trademark) D", "PERCUMYL (registered trademark) P", and "PERCUMYL (registered trademark) D", all of these being manufactured by NOF Corp.

When the resin composition includes the component (E), the content of the component (E) is, relative to 100% by mass of the nonvolatile components in the resin composition, preferably 0.01% or more by mass, and more preferably 0.03% or more by mass, while still more preferably 0.05% or more by mass, and preferably 1% or less by mass, and more preferably 0.5% or less by mass, while still more preferably 0.3% or less by mass.

Other Components

In the present invention, the resin composition may further include an epoxy resin other than the specific epoxy resin of the component (A) with the amount that does not excessively impair the prescribed effects of the present invention.

Illustrative examples of the epoxy resin include a bixylenol type epoxy resin, a bisphenol A type epoxy resin, a bisphenol F type epoxy resin, a bisphenol S type epoxy resin, a bisphenol AF type epoxy resin, a dicyclopentadiene type epoxy resin, a trisphenol type epoxy resin, a naphthol novolak type epoxy resin, a phenol novolak type epoxy resin, a tert-butyl-catechol type epoxy resin, a naphthalene type epoxy resin, a naphthol type epoxy resin, an anthracene type epoxy resin, a glycidyl amine type epoxy resin, a glycidyl ester type epoxy resin, a cresol novolak type epoxy resin, a biphenyl type epoxy resin, a linear aliphatic epoxy resin, an epoxy resin having a butadiene structure, an alicyclic epoxy resin, a heterocyclic epoxy resin, an epoxy resin having a spiro ring, a cyclohexane type epoxy resin, a cyclohexane dimethanol type epoxy resin, a naphthylene ether type epoxy resin, a trimethylol type epoxy resin, and a tetraphenylethane type epoxy resin. These epoxy resins may be used singly or as a combination of two or more of them.

In the epoxy resin, there are an epoxy resin that is in the state of liquid at 20° C. (hereinafter, this is also called "liquid epoxy resin") and an epoxy resin that is in the state of solid at 20° C. (hereinafter, this is also called "solid epoxy resin"). The resin composition for resin sheets according to the present invention may include, as the epoxy resin, only the liquid epoxy resin, or only the solid epoxy resin, or combination of the liquid epoxy resin and the solid epoxy resin.

Specific examples of the liquid epoxy resin include "HP4032", "HP4032D", and "HP4032SS" (these are naphthalene type epoxy resins) manufactured by DIC Corp.; "828US", "jER828EL", "825", and "Epikote 828EL" (these are bisphenol A type epoxy resins) manufactured by Mitsubishi Chemical Corp.; "jER807" and "1750" (both are bisphenol F type epoxy resins) manufactured by Mitsubishi Chemical Corp.; "jER152" (a phenol novolak type epoxy resin) manufactured by Mitsubishi Chemical Corp.; "630" and "630LSD" (these are glycidyl amine type epoxy resins) manufactured by Mitsubishi Chemical Corp.; "ZX1059" (a mixture of a bisphenol A type epoxy resin and a bisphenol F type epoxy resin) manufactured by NIPPON STEEL Chemical & Material Co., Ltd.); "EX-721" (a glycidyl ester type epoxy resin) manufactured by Nagase ChemteX Corp.; "Celloxide 2021P" (an alicyclic epoxy resin having an ester skeleton) manufactured by Daicel Corp.; "PB-3600" (an epoxy resin having a butadiene structure) manufactured by Daicel Corp.; and "ZX1658" and "ZX1658GS" (both are liquid 1,4-glycidyl cyclohexane type epoxy resins) manufactured by NIPPON STEEL Chemical & Material Co., Ltd.

Specific examples of the solid epoxy resin include "HP4032H" (a naphthalene epoxy type resin) manufactured by DIC Corp.; "HP-4700" and "HP-4710" (both are naphthalene type tetrafunctional epoxy resins) manufactured by DIC Corp.; "N-690" (a cresol novolak type epoxy resin) manufactured by DIC Corp.; "N-695" (a cresol novolak type epoxy resin) manufactured by DIC Corp.; "HP-7200HH", "HP-7200H", and "HP-7200" (these are dicyclopentadiene type epoxy resins) manufactured by DIC Corp.); "EXA-7311", "EXA-7311-G3", "EXA-7311-G4", "EXA-7311-G4S", and "HP6000" (these are naphthylene ether type epoxy resins) manufactured by DIC Corp.; "EPPN-502H" (a trisphenol type epoxy resin) manufactured by Nippon Kayaku Co., Ltd.; "NC7000L" (a naphthol novolak type epoxy resin) manufactured by Nippon Kayaku Co., Ltd.; "NC3000H", "NC3000", "NC3000L", and "NC3100" (these are biphenyl type epoxy resins) manufactured by Nippon Kayaku Co., Ltd.; "ESN475V" (a naphthol type epoxy resin) manufactured by NIPPON STEEL Chemical & Material Co., Ltd.; "ESN485" (a naphthol novolak type epoxy resin) manufactured by NIPPON STEEL Chemical & Material Co., Ltd.; "YX4000H", "YX4000", and "YL6121" (these are biphenyl type epoxy resins) manufactured by Mitsubishi Chemical Corp.; "YX4000HK" (a bixylenol type epoxy resin) manufactured by Mitsubishi Chemical Corp.;

"YX8800" (an anthracene type epoxy resin) manufactured by Mitsubishi Chemical Corp.; "PG-100" and "CG-500" manufactured by Osaka Gas Chemicals Co., Ltd.; "YL7760" (a bisphenol AF type epoxy resin) manufactured by Mitsubishi Chemical Corp.; "YL7800" (a fluorene type epoxy resin) manufactured by Mitsubishi Chemical Corp.; "jER1010" (a solid bisphenol A type epoxy resin) manufactured by Mitsubishi Chemical Corp.; and "jER1031S" (a tetraphenylethane type epoxy resin) manufactured by Mitsubishi Chemical Corp.

The epoxy equivalent of the component (B) is preferably in the range of 50 to 5,000 g/eq., more preferably in the range of 50 to 3,000 g/eq., and still more preferably in the range of 80 to 2,000 g/eq., while far still more preferably in the range of 110 to 1,000 g/eq. The epoxy equivalent is a mass of the compound containing one equivalent of the epoxy group. The epoxy equivalent can be measured in accordance with JIS K7236.

The weight-average molecular weight (Mw) of the epoxy resin is preferably in the range of 100 to 5,000, and more preferably in the range of 250 to 3,000, while still more preferably in the range of 400 to 1,500. The Mw of the epoxy resin can be measured as a value in terms of polystyrene by a gel permeation chromatography (GPC) method.

When the resin composition includes the epoxy resin, the content of the epoxy resin in the resin composition is, relative to 100% by mass of the nonvolatile components in the resin composition, preferably 0.1% or more by mass, and more preferably 0.3% or more by mass, while still more preferably 0.5% or more by mass, 1% or more by mass, or 1.5% or more by mass, and preferably 10% or less by mass, while more preferably 5% or less by mass, or 3% or less by mass.

The resin composition may further include an arbitrary additive. Illustrative examples of the additive like this include: organic fillers such as a rubber particle; organometallic compounds such as an organocopper compound, an organozinc compound, and an organocobalt compound; colorants such as phthalocyanine blue, phthalocyanine green, iodine green, diazo yellow, crystal violet, titanium oxide, and carbon black; polymerization inhibitors such as hydroquinone, catechol, pyrogallol, and phenothiazine; leveling agents such as a silicone type leveling agent and an acrylic polymer type leveling agent; thickeners such as bentone and montmorillonite; antifoaming agents such as a silicone type antifoaming agent, an acrylic antifoaming agent, a fluorine type antifoaming agent, and a vinyl resin type antifoaming agent; UV absorbers such as a benzotriazole type UV absorber; adhesion enhancers such as a urea silane; adhesion assisting agents such as a triazole type adhesion assisting agent, a tetrazole type adhesion assisting agent, and a triazine type adhesion assisting agent; antioxidants such as a hindered phenol type antioxidant and a hindered amine type antioxidant; fluorescent whitening agents such as a stilbene derivative; surfactants such as a fluorine type surfactant and a silicone type surfactant; flame retardants such as phosphorous type flame retardants (for example, phosphate esters, phosphazene compounds, phosphinate compounds, and red phosphorous), nitrogen type flame retardants (for example, melamine sulfate), halogen type flame retardants, and inorganic type flame retardants (for example, antimony trioxide); dispersants such as a phosphate ester type dispersant, a polyoxyalkylene type dispersant, an acetylene type dispersant, a silicone type dispersant, an anionic dispersant, and a cationic dispersant; and stabilizers such as a borate type stabilizer, a titanium type stabilizer, an aluminate type stabilizer, a zirconate type stabilizer, an isocyanate type stabilizer, a carboxylate type stabilizer, and a carboxylic anhydride type stabilizer. These additives may be used singly, or as a combination of two or of these additives. The contents of them will be appropriately determined by a person ordinally skilled in the art.

The resin composition may further include, in addition to the non-volatile components described above, an arbitrary organic solvent as a volatile component. Heretofore known solvents may be arbitrarily used as the organic solvent without any particular restriction. Illustrative examples of the organic solvent include: ketone type solvents such as acetone, methyl ethyl ketone, methyl isobutyl ketone, and cyclohexanone; ester type solvents such as methyl acetate, ethyl acetate, butyl acetate, isobutyl acetate, isoamyl acetate, methyl propionate, ethyl propionate, and γ-butyrolactone; ether type solvents such as tetrahydropyran, tetrahydrofuran, 1,4-dioxane, diethyl ether, diisopropyl ether, dibutyl ether, and diphenyl ether; alcohol type solvents such as methanol, ethanol, propanol, butanol, and ethylene glycol; ether ester type solvents such as 2-ethoxyethyl acetate, propylene glycol monomethyl ether acetate, diethylene glycol monoethyl ether acetate, ethyl diglycol acetate, γ-butyrolactone, and methyl methoxypropionate; ester alcohol type solvents such as methyl lactate, ethyl lactate, and methyl 2-hydroxy isobutyrate; ether alcohol type solvents such as 2-methoxy propanol, 2-methoxy ethanol, 2-ethoxy ethanol, propylene glycol monomethyl ether, and diethylene glycol monobutyl ether (butyl carbitol); amide type solvents such as N,N-dimethyl formamide, N,N-dimethyl acetamide, and N-methyl-2-pyrrolidone; sulfoxide type solvents such as dimethyl sulfoxide; nitrile type solvents such as acetonitrile, and propionitrile; aliphatic hydrocarbon type solvents such as hexane, cyclopentane, cyclohexane, and methyl cyclohexane; and aromatic hydrocarbon type solvents such as benzene, toluene, xylene, ethylbenzene, and trimethylbenzene. The organic solvents may be used singly or as a combination of two or more of them.

In the present invention, the resin composition may be produced, for example, by adding into an arbitrary preparation vessel the component (A), and the component (β-1), and optionally the component (B-2), the component (C), the component (D), the component (E), the epoxy resin other than the component (A), other additive, and an organic solvent, in an arbitrary order and/or partially or simultaneously all at once, followed by mixing them. During the course of addition and mixing of these components, the temperatures of them may be appropriately controlled; and in addition, they may be heated and/or cooled temporally or throughout the process. During the course of addition and mixing of them or thereafter, the resin composition may be uniformly dispersed by stirring or shaking by using stirring equipment such as a mixer or shaking equipment. Also, simultaneously with stirring or shaking, defoaming may be carried out under a reduced pressure condition such as under a vacuum condition.

As described above, the resin composition according to the present invention including a combination of the component (A) and the component (B-1) realizes a novel resin composition giving a cured product that is low in the roughness and excellent in the conductor adhesion. In addition, the resin composition according to the present invention can realize a cured product having excellent characteristics, not only in the roughness and the conductor adhesion, but also in the dielectric characteristic, the heat resistance, and the HAST resistance.

In one embodiment, the cured product of the resin composition according to the present invention has the characteristic that the conductor adhesion thereof is excellent. For example, the peel strength measured with the method described in the paragraph of "Assessment of Conductor Adhesin" to be described later can be 0.40 kgf/cm or more, 0.42 kgf/cm or more, or 0.44 kgf/cm or more. The upper limit thereof can be automatically determined in accordance with the composition and the like of the resin composition.

In one embodiment, the cured product of the resin composition according to the present invention has the characteristic that the roughness thereof is low. For example, the arithmetic surface roughness (Ra) measured with the method described in the paragraph of "Assessment of Low Roughness" to be described later can be less than 150 nm, 100 nm or less, 80 nm or less, or 60 nm or less. The lower limit thereof can be automatically determined in accordance with the composition and the like of the resin composition.

In one embodiment, the cured product of the resin composition according to the present invention tends to have the characteristic that the dielectric characteristic thereof is excellent. For example, the dielectric loss tangent (Df) measured with the method described in the paragraph of "Assessment of Dielectric Characteristic" to be described later can be less than 0.0050, 0.0045 or less, or 0.0042 or less. Therefore, in one preferable embodiment, the resin composition whose cured product has the dielectric loss tangent of less than 0.005 can be provided.

In one embodiment, the cured product of the resin composition according to the present invention tends to have the characteristic that the heat resistance thereof is excellent. For example, the glass transition temperature measured with the method (TMA method) described in the paragraph of "Assessment of Heat Resistance" to be described later can be 145° C. or higher, higher than 145° C., 150° C. or higher, 155° C. or higher, or 157° C. or higher. The upper limit thereof can be automatically determined in accordance with the composition and the like of the resin composition. In one preferable embodiment, the resin composition whose cured product has the glass transition temperature of higher than 145° C. can be provided. In one more preferable embodiment, the resin composition whose cured product has the dielectric loss tangent of less than 0.005 and the glass transition temperature of higher than 145° C. can be provided.

In one embodiment, the cured product of the resin composition according to the present invention tends to have the characteristic that the HAST resistance thereof is excellent. For example, the difference in the copper foil peel strength ($P_1$−$P_0$) before and after the HAST resistance measured by the method described in the paragraph of "Assessment of HAST Resistance" to be described later can be less than 0.50 kgf/cm, 0.45 kgf/cm or less, or 0.42 kgf/cm or less. For example, the copper foil peel strength $P_1$ after the HAST resistance measured by the method described in the paragraph of "Assessment of HAST Resistance" to be described later can be 0.10 kgf/cm or more, 0.15 kgf/cm or more, 0.20 kgf/cm or more, or 0.25 kgf/cm or more.

The resin composition according to the present invention may be preferably used as the resin composition for insulation, especially as the resin composition to form an insulating layer. Specifically, this can be preferably used as the resin composition to form the insulating layer in a printed wiring board (resin composition for insulating layer in printed wiring board), while more preferably as the resin composition to form an interlayer insulating layer in a printed wiring board (interlayer insulating layer of printed wiring board). The resin composition according to the present invention can give an insulating layer having an excellent part-embedding property, so that this can be suitably used when the printed wiring board is a part-embedded circuit board. The resin composition according to the present invention may also be preferably used as the resin composition to form an insulating layer on which a conductive layer (including redistribution layer) is formed (resin composition for insulating layer to form conductive layer). Furthermore, the resin composition according to the present invention may be used in a wide use range where the resin composition is required.

Illustrative examples of these uses include: a sheet lamination material such as a resin sheet and a prepreg; and a solder resist, a underfill material, a die bonding material, a semiconductor sealing material, a hole-filling resin, and a part-embedding resin.

Resin Sheet

Although the resin composition according to the present invention may also be used in a varnish state so as to be applied, industrially, in general, it is preferable to use this in the form of a sheet lamination material containing the resin composition.

The sheet lamination material is preferably a resin sheet and a prepreg as described below.

In one embodiment, the resin sheet is formed of a supporting body (support) and a layer of the resin composition that is formed on this supporting body (hereinafter, this resin layer is simply called "resin composition layer"). Here, the resin composition layer is characterized by being formed of the resin composition according to the present invention.

In view of the thinning of a printed wiring board, and providing a cured product having a superior insulating property even if the cured product of this resin composition is a thin film, the thickness of the resin composition layer is preferably 50 μm or less, while more preferably 40 μm or less. The lower limit of the thickness of the resin composition layer is not particularly restricted, and it can be usually 5 μm or more, 10 μm or more, or the like.

Illustrative examples of the supporting body include a film formed of a plastic material, metal foil, and a releasing paper. Among them, a film formed of a plastic material and metal foil are preferable.

When a film formed of a plastic material is used as the supporting body, illustrative examples of the plastic material include: polyesters such as polyethylene terephthalate (PET) and polyethylene naphthalate (PEN); polycarbonate (PC); acrylics such as polymethyl methacrylate (PMiA); cyclic polyolefin, triacetyl cellulose (TAC), polyether sulfide (PES), polyether ketone, and polyimide. Among these, polyethylene terephthalate and polyethylene naphthalate are preferable, while unexpensive polyethylene terephthalate is especially preferable.

In the case that metal foil is used as the supporting body, illustrative examples of the metal foil include copper foil and aluminum foil, and copper foil is preferable. As to the copper foil, the foil formed of a copper single metal or an alloy of copper with other metal (for example, tin, chromium, silver, magnesium, nickel, zirconium, silicon, titanium, and the like) may be used.

The supporting body may be subjected to a mat treatment, a corona treatment, or an antistatic treatment on the surface to be bonded with the resin composition layer. As to the supporting body, a releasing layer-attached supporting body having a releasing layer on the surface to be bonded with the resin composition layer may be used. The releasing agent to be used in the releasing layer of the releasing layer-attached supporting body may be one or more releasing agents selected from the group consisting of, for example, an alkyd resin, a polyolefin resin, a urethane resin, and a silicone resin. A commercially available good may also be used as the releasing layer-attached supporting body. Illustrative examples thereof include a PET film having a releasing layer mainly formed of an alkyd resin type releasing agent, such as "SK-1", "AL-5", and "AL-7" manufactured by Lintech Corp.; "Lumirror T60" manufactured by Toray Industries; "Purex" manufactured by Teijin Ltd.; and "Unipeel" manufactured by Unitika Ltd.

The thickness of the supporting body is not particularly restricted, and it is preferably in the range of 5 to 75 μm, while more preferably in the range of 10 to 60 μm. When the releasing layer-attached supporting body is used, total thickness of the releasing layer-attached supporting body is preferably within this range.

As for the supporting body, metal foil attached with a supporting substrate in which thin metal foil adheres to the supporting substrate that is peelable may also be used. In one embodiment, the metal foil attached with the supporting substrate includes the supporting substrate, a releasing layer formed on the supporting substrate, and the metal foil formed on the releasing layer. When the metal foil attached with the supporting substrate is used as the supporting body, the resin composition layer is formed on the metal foil.

In the metal foil attached with the supporting substrate, the material of the supporting substrate is not particularly restricted. Illustrative examples thereof include copper foil, aluminum foil, stainless steel foil, titanium foil, and copper alloy foil. When the copper foil is used as the supporting substrate, this may be electrolytic copper foil or rolled copper foil. The releasing layer is not particularly restricted so far as the metal foil can be removed from the supporting substrate; so, illustrative examples thereof include: an alloy layer of the element selected from the group consisting of Cr, Ni, Co, Fe, Mo, Ti, W, and P; and an organic coat film.

In the metal foil attached with the supporting substrate, the material of the metal foil is preferably, for example, the copper foil and the copper alloy foil.

In the metal foil attached with the supporting substrate, although the thickness of the supporting substrate is not particularly restricted, this is preferably in the range of 10 to 150 μm, while more preferably in the range of 10 to 100 μm. The thickness of the metal foil may be made, for example, in the range of 0.1 to 10 μm.

In one embodiment, the resin sheet may further include an arbitrary layer, if necessary. The arbitrary layer may be, for example, among others, a protection film or the like formed on the surface of the resin composition layer not bonded with the supporting body (namely, the surface opposite to the supporting body). The thickness of the protection film is not particularly restricted, and it is, for example, in the range of 1 to 40 μm. By providing the protection film, the resin composition layer may be prevented from attachment of dirt and the like as well as from a scar on the surface thereof.

The resin sheet may be produced, for example, as follows. The resin composition in a liquid state as it is, or a resin varnish prepared by dissolving the resin composition into an organic solvent is applied onto a supporting body by means of a die coater or the like; and then, this is dried to form the resin composition layer.

Organic solvents the same as those explained as the component in the resin composition may be used. These organic solvents may be used singly or as a combination of two or more of them.

Drying may be carried out by a heretofore known method such as heating, and blowing of a hot air. The drying condition is not particularly restricted. Drying is carried out so as to bring the content of the organic solvent in the resin composition layer to 10% by mass or less, while preferably to 5% by mass or less. In the case that the resin composition containing an organic solvent with the amount, for example, in the range of 30 to 60% by mass, or the resin varnish containing an organic solvent with the same amount is used, the resin composition layer may be formed by drying thereof at 50 to 150° C. for 3 to 10 minutes, although these conditions are different depending on the boiling point of the organic solvent contained in the resin composition or in the resin varnish.

The resin sheet can be rolled up so as to be stored. In the case that the resin sheet has the protection film, the resin sheet can be used after the protection film is removed.

In one embodiment, a prepreg is formed by impregnating a sheet-like fibrous substrate with the resin composition according to the present invention.

The sheet-like fibrous substrate to be used in the prepreg is not particularly restricted. Those usually used as the substrate for a prepreg, such as a glass cloth, an aramid unwoven cloth, and a liquid crystal polymer unwoven cloth may be used. In view of the thinning of a printed wiring board, the thickness of the sheet-like fibrous substrate is preferably 50 μm or less, more preferably 40 μm or less, and still more preferably 30 μm or less, while especially preferably 20 μm or less. The lower limit of the thickness of the sheet-like fibrous substrate is not particularly restricted. Usually, the thickness thereof is 10 μm or more.

The prepreg may be produced by a heretofore known method such as a hot melt method, and a solvent method.

The thickness of the prepreg can be made within the same range as that of the resin composition layer in the resin sheet described above.

The sheet lamination material according to the present invention may be preferably used to form an insulating layer in a printed wiring board (a material for an insulating layer in a printed wiring board), while more preferably to form an interlayer insulating layer in a printed wiring board (a material for an interlayer insulating layer in a printed wiring board).

Printed Wiring Board

The printed wiring board according to the present invention includes an insulating layer formed of a cured product of the resin composition according to the present invention.

The printed wiring board may be produced, for example, by using the resin sheet described above by a method including following processes (I) and (II):

(I) process to laminate a resin sheet on an inner layer substrate so as to bond a resin composition layer of the resin sheet with the inner layer substrate, and (II) process to cure the resin composition layer (for example, thermal cure) thereby forming an insulating layer.

Thus, a method for producing a printed wiring board according to the present invention, comprises at least one step of forming an insulating layer of the printed wiring board by using the resin composition or the resin sheet as described above.

"Inner layer substrate" used in the process (I) is a component to become a substrate of a printed wiring board; and illustrative examples thereof include a glass epoxy substrate, a metal substrate, a polyester substrate, a polyimide substrate, a BT resin substrate, and a thermosetting polyphenylene ether substrate. This substrate may have a conductive layer on one side or both sides thereof; and this conductive layer may be pattern-processed. The inner layer substrate having a conductive layer (circuit) on one side or both sides of the substrate can also be called “inner layer circuit substrate”. An intermediate product with which an insulating layer and/or a conductive layer is to be formed at the time of producing a printed wiring board is also included in the “inner layer substrate” according to the present invention. When the printed wiring board is a component-incorporated circuit board, an inner substrate incorporated with the component may be used.

Lamination of the resin sheet to the inner layer substrate may be carried out, for example, by hot-press adhesion of the resin sheet to the inner layer substrate from the supporting body side thereof. Illustrative examples of the component for hot-press adhesion of the resin sheet to the inner layer substrate (hereinafter, this component is also called “hot-pressing component”) include a heated metal plate (a SUS mirror plate and the like) and a heated metal roll (a SUS roll). At this time, the resin sheet may be pressed directly by the hot-pressing component or via an elastic material such as a heat-resistant rubber so that the resin sheet may sufficiently follow the surface irregularity of the inner layer substrate.

Lamination of the resin sheet to the inner layer substrate may be carried out by a vacuum lamination method. In the vacuum lamination method, the temperature of the hot-press adhesion is preferably in the range of 60 to 160° C., while more preferably in the range of 80 to 140° C. The pressure of the hot-press adhesion is preferably in the range of 0.098 to 1.77 MPa, while more preferably in the range of 0.29 to 1.47 MPa. The period of the hot-press adhesion is preferably in the range of 20 to 400 seconds, while more preferably in the range of 30 to 300 seconds. The lamination can be carried out under evacuated condition of preferably 26.7 hPa or less of the pressure.

Lamination may be carried out by using a commercially available vacuum laminator. Illustrative examples of the commercially available vacuum laminator include a vacuum press type laminator manufactured by Meiki Co., Ltd., and a vacuum applicator and a batch type vacuum press laminator, both being manufactured by Nikko-Materials Co., Ltd.

After the lamination, for example, the laminated resin sheet may be flattened by pressing the hot-pressing component from the side of the supporting body thereof under a normal pressure (under an atmospheric pressure). The pressing conditions of the flattening process can be made as same as the hot-press adhesion conditions in the before-mentioned lamination. The flattening process may be carried out by using a commercially available laminator. The lamination and the flattening processes may be carried out continuously by using the commercially available vacuum laminator described above.

The supporting body may be removed between the process (I) and the process (II), or after the process (II). When the metal foil is used as the supporting body, a conductive layer may be formed by using the metal foil without removing the supporting body. When the metal foil attached with the supporting substrate is used as the supporting body, the supporting substrate (and the releasing layer) may be removed. Then, the conductive layer may be formed by using the metal foil.

In the process (II), the resin composition layer is cured (for example, thermally cured) to form an insulating layer formed of a cured product of the resin composition. Curing conditions of the resin composition layer are not particularly restricted, so that the conditions usually used to form an insulating layer of a printed wiring board may be used.

Thermosetting conditions of the resin composition layer are different depending on the resin composition and the like. For example, in one embodiment, the curing temperature is preferably in the range of 120 to 250° C., and more preferably in the range of 150 to 240° C., while still more preferably in the range of 180 to 230° C. The curing period can be preferably in the range of 5 to 240 minutes, and more preferably in the range of 10 to 150 minutes, while still more preferably in the range of 15 to 120 minutes.

Before the resin composition layer is thermally cured, the resin composition layer may be pre-heated at the temperature lower than the curing temperature. For example, prior to thermosetting of the resin composition layer, the resin composition layer may be pre-heated in the temperature range of 50 to 120° C., and preferably in the range of 60 to 115° C., while more preferably in the range of 70 to 110° C., and for the period of 5 minutes or longer, preferably in the range of 5 to 150 minutes, and more preferably in the range of 15 to 120 minutes, while still more preferably in the range of 15 to 100 minutes.

In production of the printed wiring board, a process (III) to make a hole in the insulating layer, a process (IV) to roughen the insulating layer, and a process (V) to form a conductive layer may be further carried out. The processes from (III) to (V) may be carried out in accordance with various methods heretofore known to a person ordinarily skilled in the art in production of a printed wiring board. In the case that the supporting body is removed after the process (II), removal of the supporting body may be carried out between the process (II) and the process (III), or between the process (III) and the process (IV), or between the process (IV) and the process (V). As needed, processes (I) to (V), i.e., formation of the insulating layer and the conductive layer, may be repeated to form a multilayer wiring board.

In another embodiment, the printed wiring board according to the present invention may be produced by using the above-mentioned prepreg. The production method thereof is basically the same as the production method of the resin sheet.

In the process (III), a hole is created in the insulating layer. With this, a hole such as a via hole, and a through hole can be formed in the insulating layer. The process (III) may be carried out by using, for example, a drill, a laser, a plasma, or the like in accordance with composition and the like of the resin composition used to form the insulating layer. The size and shape of the hole may be arbitrarily determined in accordance with a design of the printed wiring board.

In the process (IV), the insulating layer is roughened. Usually, in the process (IV), a smear is removed as well. The procedure and condition of the roughening process are not particularly restricted, so that heretofore known procedure and condition usually used to form an insulating layer of a printed wiring board can be used. The roughening process of the insulating layer may be carried out, for example, by a method in which a swelling treatment with a swelling liquid, a roughening treatment with an oxidant, and a neutralizing treatment with a neutralizing solution are carried out in this order.

The swelling liquid to be used in the roughening process is not particularly restricted, and illustrative examples of the swelling liquid include an alkaline solution and a surfactant solution. Among them, an alkaline solution is preferable, while a sodium hydroxide solution and a potassium hydroxide solution are more preferable as the alkaline solution. Illustrative examples of the swelling liquid that is commercially available include “Swelling Dip Securiganth P” and “Swelling Dip Securiganth SBU”, both being manufactured by Atotech Japan Co., Ltd. The swelling treatment with the swelling liquid is not particularly restricted, and for example, can be carried out by soaking the insulating layer into the swelling liquid in the temperature range of 30 to 90° C. and for the period of 1 to 20 minutes. In view of suppressing the swelling of the resin in the insulating layer to a suitable level, it is preferable to soak the insulating layer into the swelling liquid in the temperature range of 40 to 80° C. and for the period of 5 to 15 minutes.

Oxidant to be used in the roughening process is not particularly restricted, and illustrative examples of the oxidant include an alkaline permanganate solution having potassium permanganate or sodium permanganate dissolved into a sodium hydroxide aqueous solution. The roughening process with an oxidant such as the alkaline permanganate solution may be carried out preferably by soaking the insulating layer into the oxidant solution heated to 60 to 100° C. for the period of 10 to 30 minutes. The concentration of the permanganate salt in the alkaline permanganate solution is preferably in the range of 5 to 10% by mass. Illustrative examples of the oxidant that is commercially available include alkaline permanganate solutions such as "Concentrate Compact CP", and "Dosing Solution Securiganth P", both being manufactured by Atotech Japan, Co., Ltd.

The neutralization solution to be used in the roughening process is preferably an acidic aqueous solution, and illustrative examples of the commercially available neutralization solution include "Reduction Solution Securiganth P" manufactured by Atotech Japan Co., Ltd.

Treatment with the neutralization solution can be carried out by soaking the surface treated with the roughening process by using the oxidant into the neutralization solution in the temperature range of 30 to 80° C. for the period of 5 to 30 minutes. In view of workability, it is preferable to soak the object treated with the roughening process by using the oxidant into the neutralization solution in the temperature range of 40 to 70° C. for the period of 5 to 20 minutes.

In the process (V), a conductive layer is formed; the conductive layer is formed on the insulating layer. There is no particular restriction in the conductive material to be used in the conductive layer. In a preferred embodiment, the conductive layer includes one or more metals selected from the group consisting of gold, platinum, palladium, silver, copper, aluminum, cobalt, chromium, zinc, nickel, titanium, tungsten, iron, tin, and indium. The conductive layer may be a single metal layer or a metal alloy layer. Illustrative examples of the metal alloy layer include layers formed of metal alloys of two or more metals selected from the group mentioned above (for example, nickel-chromium alloy, copper-nickel alloy, and copper-titanium alloy). Among them, in view of general applicability to formation of the conductive layer, cost, easy patterning, and the like, preferable are single metal layers of chromium, nickel, titanium, aluminum, zinc, gold, palladium, silver, or copper; and metal alloy layers of a nickel-chromium alloy, a copper-nickel alloy, and a copper-titanium alloy. Among them, more preferable are single metal layers of chromium, nickel, titanium, aluminum, zinc, gold, palladium, silver, or copper, or a metal alloy layer of a nickel-chromium alloy. A single metal layer of copper is still more preferable.

The conductive layer may be of a single layer structure or of a multiple layer structure that includes two or more laminated single metal layers or metal alloy layers formed of different metals or metal alloys. In the case that the conductive layer is of the multiple layer structure, the layer contacting with the insulating layer is preferably a single metal layer of chromium, zinc, or titanium, or a metal alloy layer of a nickel-chromium alloy.

The thickness of the conductive layer is generally in the range of 3 to 35 μm, while preferably in the range of 5 to 30 μm, although these values depend on the intended design of the printed wiring board.

In one embodiment, the conductive layer may be formed by plating. For example, the conductive layer having an intended wiring pattern may be formed by plating on the surface of the insulating layer by a conventional heretofore known technology such as a semi-additive method, and a full additive method. In view of convenience in the production thereof, it is preferable to form the conductive layer by a semi-additive method. Hereinafter, an example will be described in which the conductive layer is formed by a semi-additive method.

First, a plated seed layer is formed onto the surface of the insulating layer by electroless plating. Next, onto the plated seed layer thus formed, a mask pattern is formed so as to expose part of the plated seed layer in accordance with an intended wiring pattern. After a metal layer is formed by electroplating onto the plated seed layer thus exposed, the mask pattern is removed. Thereafter, an unnecessary plated seed layer is removed by etching or the like, so that the conductive layer having the intended wiring pattern can be formed.

In an alternative embodiment, the conductive layer may be formed by using metal foil. In the case that the conductive layer is formed by using metal foil, it is preferable to carry out the process (V) between the process (I) and the process (II). For example, after the process (I), the supporting body is removed; and the metal foil is laminated on the surface of the resin composition layer thus exposed. Lamination of the metal foil with the resin composition layer may be carried out by a vacuum lamination method. The lamination conditions may be the same as those explained in the process (I). Next, the process (II) is carried out to form the insulating layer. Thereafter, by utilizing the metal foil on the insulating layer, the conductive layer having an intended wiring pattern can be formed by a conventional heretofore known technology such as a subtractive method, and a modified semi-additive method.

The metal foil may be produced by a heretofore known method such as an electrolysis method, and a rolling method. Illustrative examples of the metal foil that is commercially available include: HLP foil and JXUT-III foil, both being manufactured by JX Nippon Mining & Metals Corp.; and 3EC-III foil and TP-III foil, both being manufactured by Mitsui Mining & Smelting Co., Ltd.

Alternatively, when the metal foil or the metal foil attached with the supporting substrate is used as the supporting body in the resin sheet, the conductive layer may be formed by using this metal foil, as described before.

Also, the resin composition according to the present invention can be suitably used, at the time of production of a semiconductor chip package, as the resin composition to form the insulating layer for forming the redistribution layer (resin composition for forming redistribution layer) and as the resin composition to seal the semiconductor chip (resin composition for semiconductor chip sealing). The technology to produce the semiconductor chip package by using a resin composition (resin sheet) has been widely known in this field; so, the resin composition and resin sheet according to the present invention can be used in any method and technology.

Semiconductor Device

The semiconductor device according to the present invention includes the insulating layer formed of the cured product of the resin composition layer according to the present invention. The semiconductor device according to the present invention may be produced by using the printed wiring board or the semiconductor package according to the present invention. Thus, a method for producing a semiconductor device according to the present invention, comprises at least one step of forming at least one insulating layer of the semiconductor device by using the resin composition or the resin sheet as described above described above.

The semiconductor device may be various semiconductor devices to be supplied to electric products (for example, a computer, a mobile phone, a digital camera, and a television), vehicles (for example, a motor bike, an automobile, an electric train, a marine ship, and an airplane), and the like.

Other features of the invention will become apparent in the course of the following descriptions of exemplary embodiments which are given for illustration of the invention and are not intended to be limiting thereof.

EXAMPLES

In the explanation below, "parts" and "%" that are used to express quantities mean "parts by mass" and "% by mass", respectively, unless otherwise specifically mentioned. The temperature condition and the pressure condition unless otherwise specifically mentioned are a room temperature (25° C.) and an atmospheric pressure (1 atm), respectively.

Examples 1 and 2, and Comparative Examples 1 and 2

Hereinafter, illustrative aspects of the resin compositions containing the components selected from the component (A) and the component (B) will be described in Examples and Comparative Examples.

Example 1

(1) Preparation of Resin Composition 40 parts of the active ester type curing agent b1a ("HPC-8000L-65TM" (active ester type curing agent containing a dicyclopentadiene type diphenol structure); nonvolatile component of 65% by mass; functional group equivalent of 281 g/eq.; manufactured by DIC Corp.) as the component (B-1), 5 parts of the curing agent b2 ("LA-3018-50P" (cresol novolak type curing agent having a triazine skeleton); functional group equivalent (hydroxy group equivalent) of 151 g/eq.; nonvolatile component of 50% by mass (2-methoxypropanol solution); manufactured by DIC Corp.) as the component (B-2), which is other than the active ester type curing agent, 5 parts of the thermoplastic resin d ("YX7553BH30" (phenoxy resin); nonvolatile component of 30% by mass (1:1 cyclohexanone:methyl ethyl ketone (MEK) solution); manufactured by Mitsubishi Chemical Corp.) as the component (D), 50 parts of the naphthol aralkyl type epoxy resin al ("ESN-4100V" (naphthol aralkyl resin); epoxy equivalent of 360 g/eq.; weight-average molecular weight (Mw) of 1,600; manufactured by NIPPON STEEL Chemical & Material Co., Ltd.) as the component (A), 210 parts of the inorganic filler c (spherical silica "SO-C2" (average particle diameter of 0.5 μm and specific surface area of 5.8 $m^2/g$) manufactured by Admatechs Co., Ltd., surface-modified with the amine-type silane coupling agent "KBM573" manufactured by Shin-Etsu Chemical Co., Ltd.) as the component (C), and 0.1 part of the curing facilitator e ("DMAP" (4-dimethylaminopyridine); amine type curing facilitator; manufactured by Wako Pure Chemical Industries, Ltd.) as the component (E) was uniformly dispersed by using a mixer. By so doing, the resin composition including the components (A) to (E) was obtained (nonvolatile components of 93.6% by mass).

(2) Preparation of Resin Sheet

The polyethylene terephthalate film having a releasing layer ("AL5"; thickness of 38 μm; manufactured by Lintec Corp.) was prepared as the supporting body. Onto this releasing layer of the supporting body was uniformly applied the resin composition having been obtained in Examples and Comparative Examples in such a way that a thickness of the resin composition layer after dried might become 40 μm. Then, this resin composition was dried for 4 minutes in the temperature range of 80 to 100° C. (average 90° C.). Thus, a resin sheet A including the supporting body and the resin composition layer was obtained.

(3) Assessments

The assessments or evaluations to be described later were done by using the resin sheet A.

Example 2

1) a resin sheet A was prepared from the resin composition prepared by the same method as Example 1 except that in place of 40 parts of the active ester type curing agent b1a as the component (B-1), 35 parts of the active ester type curing agent bib ("HPC-8150-62T" (active ester type curing agent having a naphthalene structure); nonvolatile component of 62% by mass (toluene solution); functional group equivalent of 233 g/eq.; manufactured by DIC Corp.) was used, and that 2) the blending amount of the inorganic filler c as the component (C) was changed from 210 parts to 200 parts. The assessments were done by using the resin sheet A thus obtained.

Comparative Example 1

1) a resin sheet A was prepared from the resin composition prepared by the same method as Example 1 except that in place of the naphthol aralkyl type epoxy resin al as the component (A), 50 parts of the naphthol aralkyl type epoxy resin a' ("ESN-475V" (naphthol aralkyl resin); epoxy equivalent of 325 g/eq.; weight-average molecular weight (Mw) of 660; manufactured by NIPPON STEEL Chemical & Material Co., Ltd.) was used as a component (A'), that 2) the blending amount of the active ester type curing agent b1a as the component (B-1) was changed from 40 parts to 45 parts, and that 3) the blending amount of the inorganic filler c as the component (C) was changed from 210 parts to 220 parts. The assessments were done by using the resin sheet A thus obtained.

Comparative Example 2

1) a resin sheet A was prepared from the resin composition prepared by the same method as Comparative Example 1 except that in place of 45 part of the active ester type curing agent b1a as the component (B-1), 40 parts of the active ester type curing agent bib was used, and that 2) the blending amount of the inorganic filler c as the component (C) was changed from 220 parts to 210 parts. The assessments were done by using the resin sheet A thus obtained.

Next, the measurement methods and assessment methods will be described.

Assessment of Dielectric Characteristic; Measurement of Dielectric Loss Tangent (Df)

Each of the resin sheets A obtained in Examples and Comparative Examples was cured by heating in an oven at 190° C. for 90 minutes. The resin sheet A was taken out from the oven; then, the supporting body was removed from the resin sheet to obtain the cured product of the resin composition layer. The cured product thus obtained was cut out to the length of 80 mm and the width of 2 mm to obtain the cured product for assessment.

The dielectric loss tangent value (Df value) of the cured product for assessment was measured by using "HP8362B", manufactured by Agilent Technologies, Inc., by a cavity resonance perturbation method with the measurement frequency of 5.8 GHz and the measurement temperature of 23° C. Measurement was done for two test pieces to calculate the average value of them.

Assessment of Heat Resistance; Measurement of Glass Transition Temperature (Tg)

Each of the resin sheets A obtained in Examples and Comparative Examples was cured by heating in an oven at 190° C. for 90 minutes; then, the cured film was obtained by being removed from the supporting body. The cured film thus obtained was cut out to the length of 20 mm and the width of 6 mm to obtain the assessment sample. The glass transition temperature (Tg) of the assessment sample was measured with the temperature ascending rate of 5° C./minute in the temperature range of 25 to 250° C. by using the TMA instrument manufactured by Rigaku Corp. Measurement was done twice in the same test piece; then, the second value was recorded.

Assessment of Low Roughness; Measurement of Arithmetic Average Roughness (Ra)

(1) Preparation of Inner Layer Substrate

Both the surfaces of the dual copper clad laminate using a glass cloth substrate impregnated with an epoxy resin ("R1515A"; copper foil thickness of 18 μm; substrate thickness of 0.4 mm; manufactured by Panasonic Corp.) formed with an inner layer circuit were etched with a micro-etching agent ("CZ8101"; manufactured by MEC Co., Ltd.) with the etching amount of 1 μm to roughen the copper surface.

(2) Lamination of the Resin Sheet A

The resin sheets A were laminated on both the surfaces of the inner layer substrate by using a batch type vacuum press laminator ("CVP700"; two-stage build-up laminator; manufactured by Nikko Materials Co., Ltd.) such that the resin composition layers might contact with the inner layer substrate. The lamination was carried out such that after the pressure inside the laminator was reduced to 13 hPa or less by evacuation for 30 seconds, the resin sheets were press-adhered thereto with the pressure of 0.74 MPa at 120° C. for 30 seconds. Then, this was hot pressed with the pressure of 0.5 MPa at 100° C. for 60 seconds.

(3) Thermal Curing of the Resin Composition Layer

Next, the inner layer substrate laminated with the resin sheets A were heated in an oven at 130° C. for 30 minutes, and then this was transferred to another oven heated at 170° C., where the heating was continued for 30 minutes for thermal curing of the resin composition layers to form the insulating layers. Then, the supporting bodies were removed to obtain the cured substrate having the insulating layer, the inner layer substrate, and the insulating layer in this order.

(4) Roughening Treatment

The cured substrate was subjected to the desmear treatment as the roughening treatment. The desmear treatment was conducted by the wet desmear treatment as described below.

Wet Desmear Treatment

The cured substrate was soaked in a swelling liquid ("Swelling Dip Securiganth P"; aqueous solution of diethyleneglycol monobutyl ether and sodium hydroxide; manufactured by Atotech Japan Co., Ltd.) at 60° C. for 5 minutes, and then, in an oxidant solution ("Concentrate Compact CP"; aqueous solution of about 6% concentration of potassium permanganate and about 4% concentration of sodium hydroxide; manufactured by Atotech Japan Co., Ltd.) at 80° C. for 20 minutes. Next, after this was soaked in a neutralization solution ("Reduction Solution Securiganth P"; aqueous sulfuric acid solution; manufactured by Atotech Japan Co., Ltd.) at 40° C. for 5 minutes, this was dried at 80° C. for 15 minutes.

(5) Measurement of Arithmetic Average Roughness (Ra) of the Insulating Layer Surface after Roughening Treatment The arithmetic average roughness (Ra) of the insulating layer surface of the cured substrate after the roughening treatment (this substrate is also called "cured substrate B") was measured by using a non-contact type surface roughness meter ("WYKO NT3300"; manufactured by Bruker Corp.) with the VSI mode, the 50 magnifications lens, and the measurement range of 121 μm×92 μm. The value was obtained as the average value of 10 points.

Assessment of Conductor Adhesion; Measurement of Plating

Peel Strength (1) Formation of Copper Conductive Layer

By following the semi-additive method, the conductive layers were formed on the roughened surfaces of the insulating layers of the cured substrate B obtained in the assessment for the surface roughness. Namely, the cured substrate B was soaked in the electroless plating solution containing $PdCl_2$ at 40° C. for 5 minutes, and then in the electroless copper plating solution at 25° C. for 20 minutes. Next, after annealing by heating at 150° C. for 30 minutes, an etching resist was formed; then, a pattern was formed by etching. Then, the conductive layer with the thickness of 25 μm was formed by electroplating with copper sulfate, followed by annealing at 190° C. for 60 minutes. The substrate thus obtained is called "assessment substrate C".

(2) Measurement of Plating Peel Strength

The plating peel strength of the assessment substrate C was measured in accordance with the Japanese Industrial Standards (JIS C6481). Specifically, the conductive layer of the assessment substrate C was incised with the width of 10 mm and the length of 100 mm; then, one end of this portion was peeled off and held by a gripping tool, and this was peeled off to a vertical direction with the peeling speed of 50 mm/minute. The load (kgf/cm) at the peel of 35 mm was measured as the peel strength (plating peel strength). For the measurement, the tensile testing instrument ("AC-50C-SL"; manufactured by TSE Co., Ltd.) was used.

Assessment of HAST Resistance; Measurement of Copper Plating Peel Strength Before and After HAST Test (1) Surface Treatment of Copper Foil The glossy surface of "3EC-III" (electrolytic copper foil; 35 μm) manufactured by Mitsui Mining & Smelting Co., Ltd. was soaked in the micro-etching agent ("CZ8101"; manufactured by MEC Co., Ltd.), so that the copper surface was subjected to the roughening treatment (Ra value of 1 μm) and the rustproofing treatment (CL8300). This copper foil is called the CZ copper foil. Furthermore, this was heated in an oven at 130° C. for 30 minutes.

(2) Lamination of Copper Foil and Formation of Insulating Layer

An inner layer substrate having the resin sheets A laminated was prepared by the same manner as described before. Then, the supporting bodies on both surfaces of the substrate were removed to expose both the resin composition layers. On these resin composition layers were laminated the treated surfaces of the CZ copper foil of "3EC-III" with the same condition as lamination of the resin sheets A as described before. Then, the resin composition layers were cured with the curing condition at 190° C. for 90 minutes to form the insulating layers, so that the sample was obtained.

(3) Measurement of Copper Foil Peeling Strength (Adhesiveness to Foundation)

The sample thus prepared was cut out to a small piece having the size of 150 mm×30 mm. The copper foil portion with the width of 10 mm and the length of 100 mm in the small piece was incised by a cutter; then, one end of the copper foil was peeled off and held by a gripping tool ("AC-50C-SL"; manufactured by TSE Co., Ltd.), and this was peeled off to a vertical direction with the peeling speed of 50 mm/minute at room temperature by using the Instron type universal tester. The load (kgf/cm (N/cm)) at the peel of 35 mm was measured in accordance with JIS C6481.

Assessment of HAST Resistance; Measurement of Copper Foil Peel Strength Before and After HAST Test (1) Preparation of Sample The glossy surface of the electrolytic copper foil ("3EC-III"; thickness of 35 μm; manufactured by Mitsui Mining & Smelting Co., Ltd.) was soaked in the micro-etching agent ("CZ-8101"; manufactured by MEC Co., Ltd.) to roughen the copper surface (Ra value of 1 μm). Next, this was subjected to the rustproofing treatment by using the rust-proofing solution ("CL8300"; manufactured by MEC Co., Ltd.). The copper foils thus obtained are called CZ copper foil. This was further heated in an oven at 130° C. for 30 minutes.

As the inner layer circuit board, the dual copper clad laminate using a glass cloth substrate impregnated with an epoxy resin ("R1515A"; copper foil thickness of 18 μm; substrate thickness of 0.4 mm; manufactured by Panasonic Corp.) formed with the inner layer circuit was prepared. Next, the resin sheets A were laminated on both the surfaces of the inner layer circuit substrate by using a batch type vacuum press laminator ("MVLP-500"; manufactured by Meiki Co., Ltd.) such that the resin composition layers might contact with the inner layer circuit substrate. The lamination was conducted in such a way that after the pressure inside the laminator was reduced to 13 hPa or less by evacuation for 30 seconds, which was then followed by press-adhesion with the pressure of 0.74 MPa at 100° C. for 30 seconds. After the lamination, the supporting bodies were removed. Onto the resin composition layers thus exposed were laminated the treated surfaces of the CZ copper foils with the same condition as described before. Then, the resin composition layers were cured with the curing condition of 190° C. for 90 minutes to form the insulation layers to obtain the sample having the structure of CZ copper foil/insulating layer/inner layer circuit substrate/insulating layer/CZ copper foil.

(2) Measurement of Copper Foil Peel Strength $P_0$ Before High Temperature and High Humidity Testing (HAST)

The sample thus obtained was cut to a small piece having the size of 150 mm×30 mm. The copper foil portion with the width of 10 mm and the length of 100 mm in the small piece was incised by a cutter; then, one end of the copper foil was peeled off and held by a gripping tool ("AC-50C-SL"; manufactured by TSE Co., Ltd.), and this was peeled off to a vertical direction with the peeling speed of 50 mm/minute at room temperature by using the Instron type universal tester. The load at the peel of 35 mm was measured in accordance with JIS C6481. The load measured by the method described above is called "copper foil peel strength $P_0$".

(3) Measurement of Copper Foil Peel Strength $P_1$ after High Temperature and High Humidity Testing (HAST)

The obtained sample was cut to a small piece having the size of 150 mm×30 mm. The copper foil portion with the width of 10 mm and the length of 100 mm in the small piece was incised by a cutter; then, this was subjected to the high temperature and high humidity testing at 130° C. with 85% RH for 100 hours by using the high accelerated stress test instrument ("PM422"; manufactured by Kusumoto Chemicals, Ltd.). Next, one end of the copper foil in the longitudinal direction was peeled off and held by a gripping tool ("AC-50C-SL"; manufactured by TSE Co., Ltd.), and this was peeled off to a vertical direction with the peeling speed of 50 mm/minute at room temperature by using the Instron type universal tester. The load at the peel of 35 mm was measured in accordance with JIS C6481. The load measured by the method described above is called "copper foil peel strength $P_1$".

The results of Examples 1 and 2 and Comparative Examples 1 and 2 are summarized in Table 1.

TABLE 1

| | | Example 1 | Example 2 | Comparative Example 1 | Comparative Example 2 |
|---|---|---|---|---|---|
| Component (A) | ESN-4100V | 50 | 50 | — | — |
| Component (A') | ESN-475V | — | — | 50 | 50 |
| Component (B-1) | HPC-8000L-65TM | 26 | — | 29.3 | — |
| | HPC-8150-62T | — | 21.7 | — | 24.8 |
| Component (B-2) | LA-3018-50P | 2.5 | 2.5 | 2.5 | 2.5 |
| Component (C) | Inorganic filler c | 210 | 200 | 220 | 210 |
| Component (D) | YX7553BH30 | 1.5 | 1.5 | 1.5 | 1.5 |
| Component (E) | DMAP | 0.1 | 0.1 | 0.1 | 0.1 |
| Total of nonvolatile components (parts by mass) | | 290.1 | 275.8 | 303.4 | 288.9 |
| Content of component (A)*1 (mass %) | | 17.2 | 18.1 | — | — |
| Content of component (B)*1 (mass %) | | 9.8 | 8.8 | 10.5 | 9.4 |
| Content of component (C)*1 (mass %) | | 72.4 | 72.5 | 72.5 | 72.7 |
| Dielectric characteristic | Dielectric loss tangent (Df) | 0.004 | 0.004 | 0.005 | 0.005 |
| Heat resistance | Tg*2 (° C.) | 160 | 165 | 140 | 145 |
| Low roughness | Ra (nm) | 40 | 40 | 150 | 150 |
| Conductor adhesion | Plating peel strength (kgf/cm) | 0.45 | 0.45 | 0.45 | 0.45 |
| HAST resistance | Copper foil peel strength $P_0$*3 (kgf/cm) | 0.7 | 0.7 | 0.6 | 0.7 |
| | Copper foil peel strength $P_1$ (kgf/cm) | 0.3 | 0.4 | 0.1 | 0.1 |

*1 Value relative to 100% by mass of nonvolatile components in resin composition

*2 Based on TMA method

*3 Measured value before HAST test

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

What is claimed is:

1. A method for producing an insulating layer on an inner layer substrate, comprising:
- (I) laminating a resin sheet on said inner layer substrate so as to bond a resin composition layer of said resin sheet with said inner layer substrate, and
- (II) curing said resin composition layer, thereby forming said insulating layer;

wherein said resin composition layer comprises a resin composition comprising
- (A) at least one naphthol aralkyl epoxy resin having a weight-average molecular weight (Mw) of 1,000 or more and an epoxy equivalent of 350 g/eq or more; and
- (B) at least one curing agent, wherein
- (B) said curing agent comprises (B-1) an active ester curing agent; and the insulating layer has a dielectric loss tangent less than 0.005 measured at a frequency of 5.8 GHz and a temperature of 23° C.

2. The method according to claim 1, wherein said component (A) comprises a compound represented by formula (A1)

(A1)

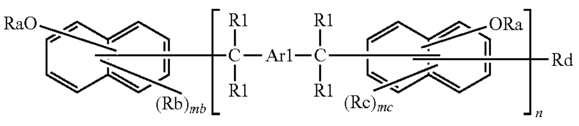

wherein
- Ar1 is an optionally substituted arylene group having 6 to 20 carbon atoms;
- each Ra independently represents a hydrogen atom, a monovalent group having an epoxy group, or an alkyl group having 1 to 12 carbon atoms, in which at least one Ra is the monovalent group having an epoxy group, and at least one Ra is the alkyl group having 1 to 12 carbon atoms;
- Rb and Rc each independently represent a monovalent group having an epoxy group, an alkyl group having 1 to 12 carbon atoms, an allyl group, or an aryl group having 6 to 10 carbon atoms;
- Rd represents a hydrogen atom, a monovalent group having an epoxy group, an alkyl group having 1 to 12 carbon atoms, an allyl group, or an aryl group having 6 to 10 carbon atoms;
- each R1 independently represents a hydrogen atom or an alkyl group having 1 to 12 carbon atoms;
- n represents an integer of 2 to 50;
- mb represents an integer of 0 to 6; and
- mc represents an integer of 0 to 5.

3. The method according to claim 2, wherein said component (A) comprises a compound represented by formula (A2)

(A2)

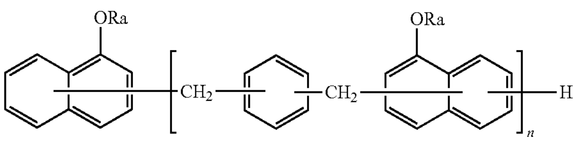

wherein Ra and n are the same as Ra and n respectively, in formula (A1).

4. The method according to claim 2, wherein n is 4 or more, and at least two Ra are an alkyl group having 1 to 6 carbon atoms.

5. The method according to claim 1, wherein said component (B-1) comprises at least one selected from the group consisting of a dicyclopentylene structure and a naphthalene structure.

6. The method according to claim 1, wherein said component (B) further comprises (B-2) a curing agent other than the active ester curing agent.

7. The method according to claim 6, wherein said component (B-2) comprises a phenol curing agent comprising a triazine skeleton.

8. The method according to claim 6, wherein said component (B-2) is present in an amount which is less than that of said component (B-1).

9. The method according to claim 1, wherein said component (B-1) is present in an amount of 3 to 50% by mass relative to 100% by mass of nonvolatile components in said resin composition.

10. The method according to claim 1, wherein said component (A) is present in an amount of 5 to 70% by mass relative to 100% by mass of nonvolatile components in said resin composition.

11. The method according to claim 1, wherein said component (B) is present in an amount of 3 to 70% by mass relative to 100% by mass of nonvolatile components in said resin composition.

12. The method according to claim 1, wherein said resin composition further comprises:

(C) at least one inorganic filler.

13. The method according to claim 12, wherein said component (C) is present in an amount of 40% or more by mass relative to 100% by mass of nonvolatile components in the resin composition.

14. The method according to claim 1, wherein said resin composition further comprises:

(D) a thermoplastic resin.

15. The method according to claim 1, wherein a glass transition temperature of said insulating layer is higher than 145° C.

16. A laminate comprising an inner layer substrate and an insulating layer bonded on said inner layer substrate, wherein said insulating layer is produced by the method according to claim 1.

17. The laminate according to claim 16, wherein said insulating layer has a glass transition temperature higher than 145° C.

18. A printed wiring board, comprising the laminate according to claim 16.

19. A semiconductor device, comprising the printed wiring board according to claim 18.

* * * * *